United States Patent
McGregor et al.

(10) Patent No.: US 8,391,017 B2
(45) Date of Patent: Mar. 5, 2013

(54) THIN-FILM CAPACITOR STRUCTURES EMBEDDED IN SEMICONDUCTOR PACKAGES AND METHODS OF MAKING

(75) Inventors: David Ross McGregor, Apex, NC (US); Cheong-Wo Hunter Chan, Lawrenceville, GA (US); Lynne E. Dellis, Willow Spring, NC (US); Fuhan Liu, Atlanta, GA (US); Deepukumar M. Nair, Cary, NC (US); Venkatesh Sundaram, Alpharetta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 281 days.

(21) Appl. No.: 12/763,433

(22) Filed: Apr. 20, 2010

(65) Prior Publication Data
US 2010/0270645 A1   Oct. 28, 2010

Related U.S. Application Data

(60) Provisional application No. 61/173,368, filed on Apr. 28, 2009.

(51) Int. Cl.
*H01L 29/86* (2006.01)
*H01L 21/768* (2006.01)
*H01L 21/50* (2006.01)
*H01L 23/522* (2006.01)

(52) U.S. Cl. ......... 361/763; 257/774; 257/E21.585; 257/E21.499; 257/E23.145; 257/E29.325; 257/532; 438/654; 438/106; 361/766

(58) Field of Classification Search ............ 257/532, 257/774, E21.585, E21.499, E23.145, E29.325; 438/654, 106; 361/763, 766
See application file for complete search history.

(56) References Cited

U.S. PATENT DOCUMENTS

| | | | |
|---|---|---|---|
| 6,256,850 | B1 | 7/2001 | Lauffer et al. |
| 6,541,137 | B1 | 4/2003 | Kingon et al. |
| 6,611,419 | B1 | 8/2003 | Chakravorty |
| 6,649,930 | B2 | 11/2003 | Farrell |
| 6,839,219 | B2 | 1/2005 | Mashiko et al. |
| 6,841,080 | B2 | 1/2005 | Kingon et al. |
| 7,029,971 | B2 | 4/2006 | Borland et al. |
| 7,150,767 | B1 | 12/2006 | Schneider et al. |
| 7,190,016 | B2 | 3/2007 | Cahalen et al. |
| 7,224,046 | B2 * | 5/2007 | Abe et al. .......... 257/668 |
| 7,687,366 | B2 * | 3/2010 | Min ................ 438/399 |
| 7,910,156 | B2 * | 3/2011 | Card et al. ......... 427/97.7 |
| 2004/0262537 | A1 | 12/2004 | Leblans |
| 2005/0001185 | A1 | 1/2005 | Everingham et al. |
| 2005/0088833 | A1 | 4/2005 | Kikuchi et al. |

(Continued)

FOREIGN PATENT DOCUMENTS
EP      1909546 A1      4/2008

OTHER PUBLICATIONS
U.S. Appl. No. 12/431,298, filed Apr. 28, 2009.
(Continued)

*Primary Examiner* — Tom Thomas
*Assistant Examiner* — Benjamin Tzu-Hung Liu
(74) *Attorney, Agent, or Firm* — Thomas | Horstemeyer, LLP

(57) ABSTRACT

Provided are semiconductor packages comprising at least one thin-film capacitor attached to a printed wiring board core through build-up layers, wherein a first electrode of the thin-film capacitor comprises a thin nickel foil, a second electrode of the thin-film capacitor comprises a copper electrode, and a copper layer is formed on the nickel foil. The interconnections between the thin-film capacitor and the semiconductor device provide a low inductance path to transfer charge to and from the semiconductor device. Also provided are methods for fabricating such semiconductor packages.

16 Claims, 29 Drawing Sheets

U.S. PATENT DOCUMENTS

| | | |
|---|---|---|
| 2006/0138591 A1 | 6/2006 | Amey, Jr. et al. |
| 2006/0281278 A1 | 12/2006 | Min |
| 2007/0049026 A1 | 3/2007 | Miyamoto et al. |
| 2007/0132088 A1 | 6/2007 | Kariya et al. |
| 2007/0134910 A1 | 6/2007 | Kariya et al. |
| 2008/0216298 A1 | 9/2008 | Dudnikov |
| 2008/0236877 A1 | 10/2008 | Amey et al. |
| 2008/0316723 A1 | 12/2008 | Borland et al. |
| 2009/0035913 A1 | 2/2009 | Bao et al. |
| 2009/0290316 A1 | 11/2009 | Kariya |

OTHER PUBLICATIONS

U.S. Appl. No. 12/763,412, filed Apr. 20, 2010.
U.S. Appl. No. 12/763,444, filed Apr. 20, 2010.

* cited by examiner

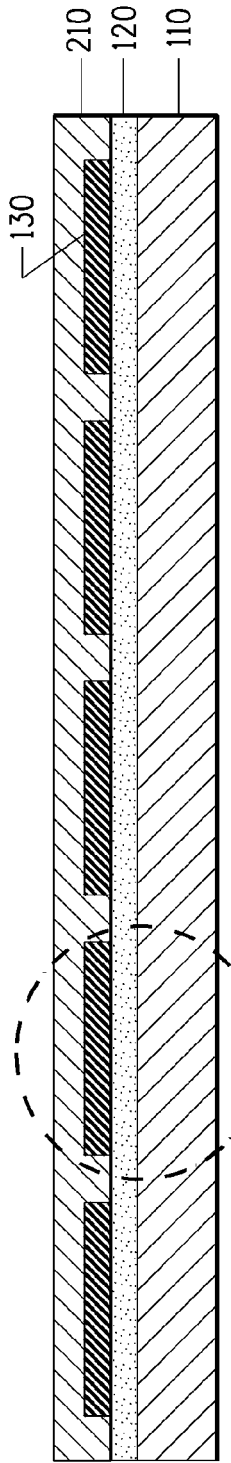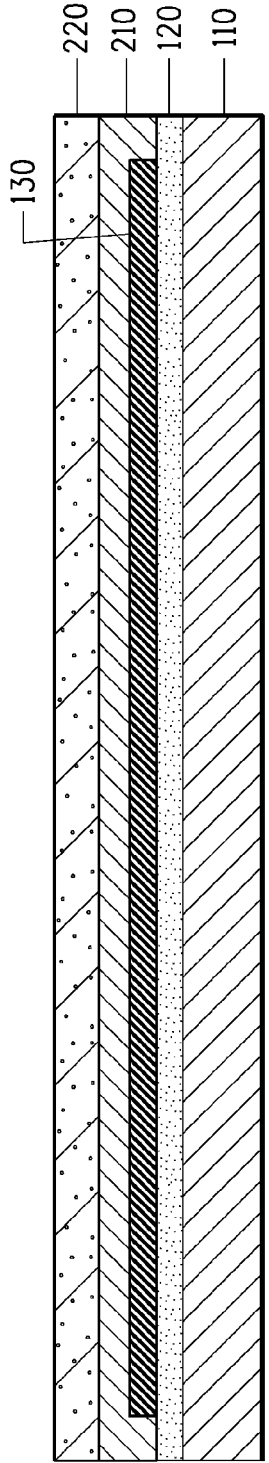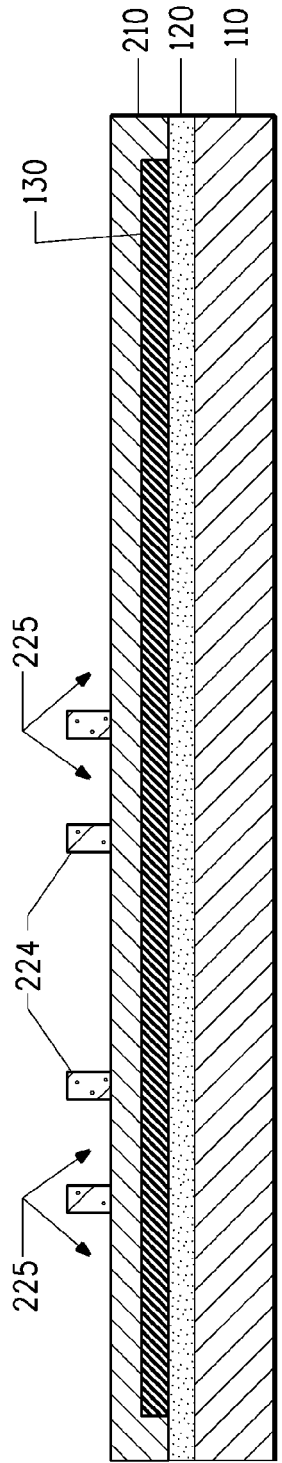

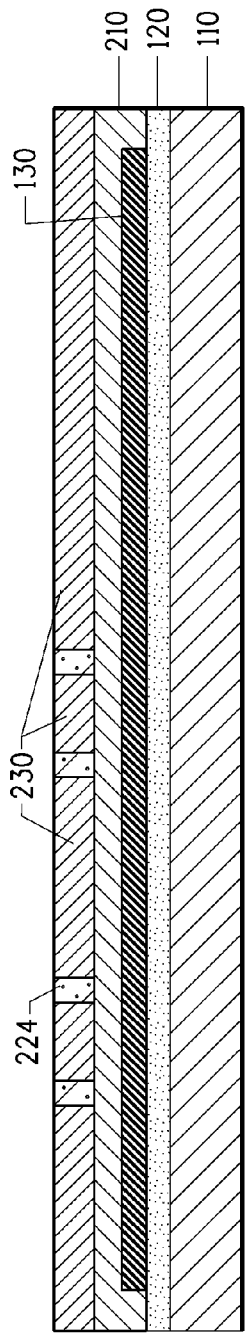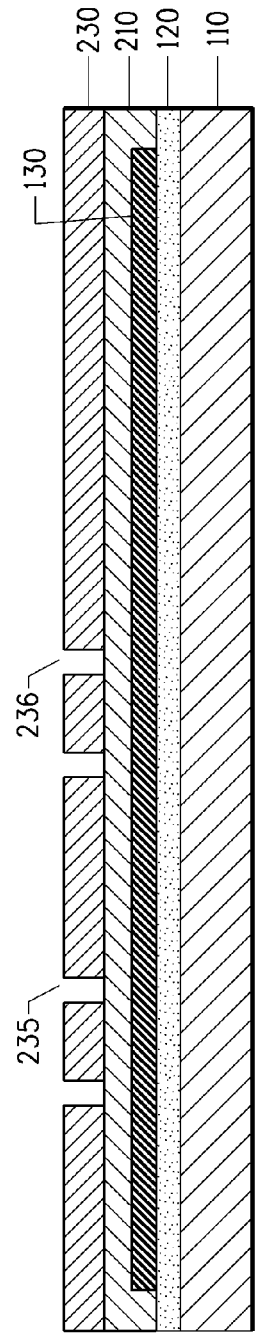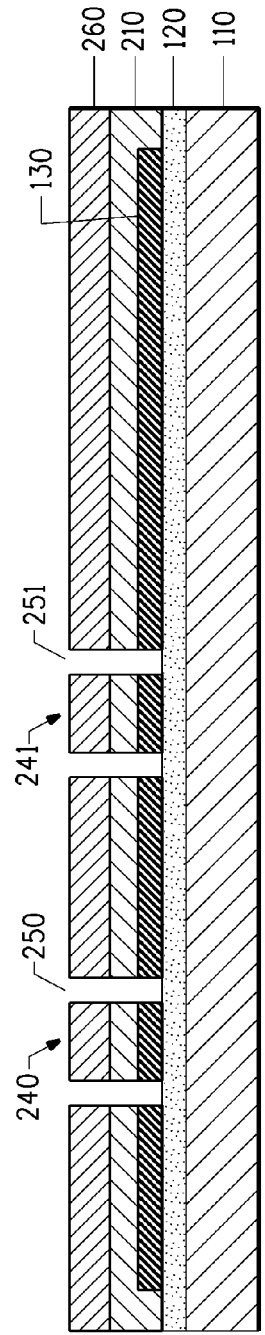

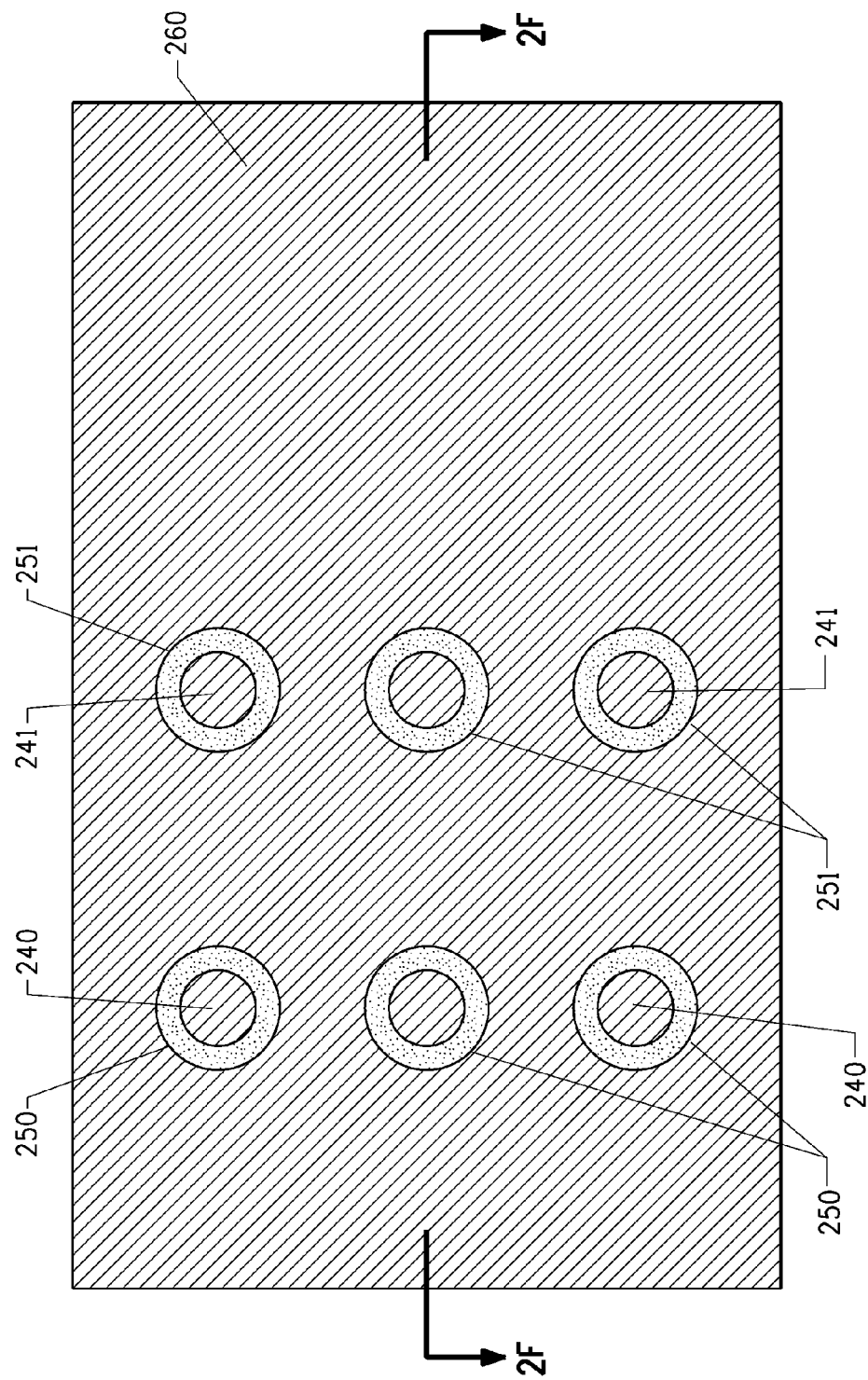

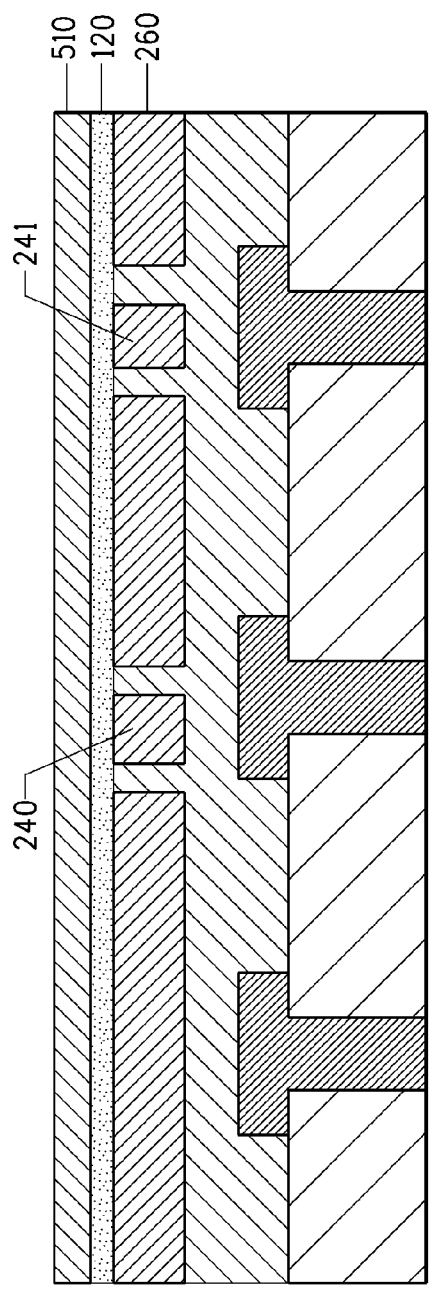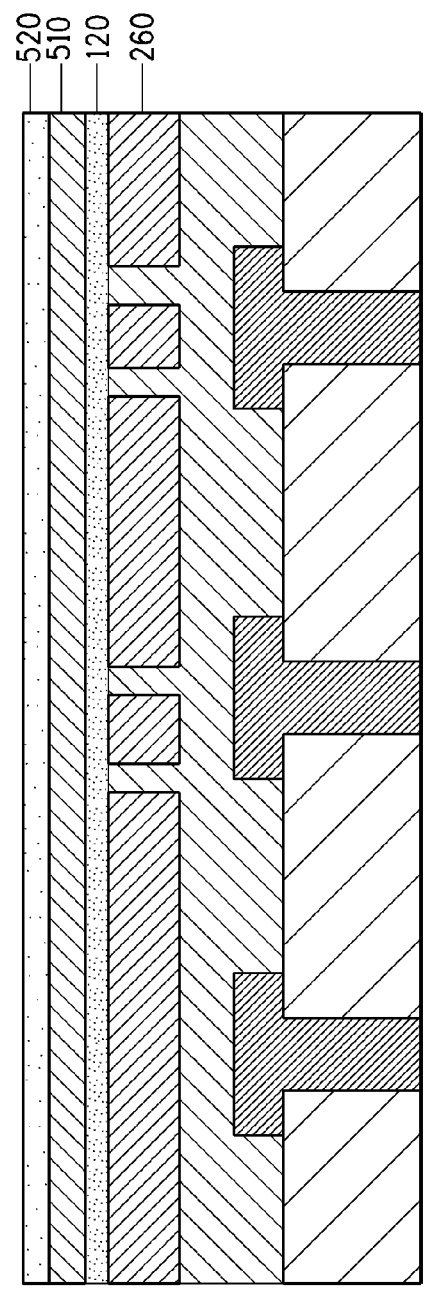
FIG. 5A
FIG. 5B

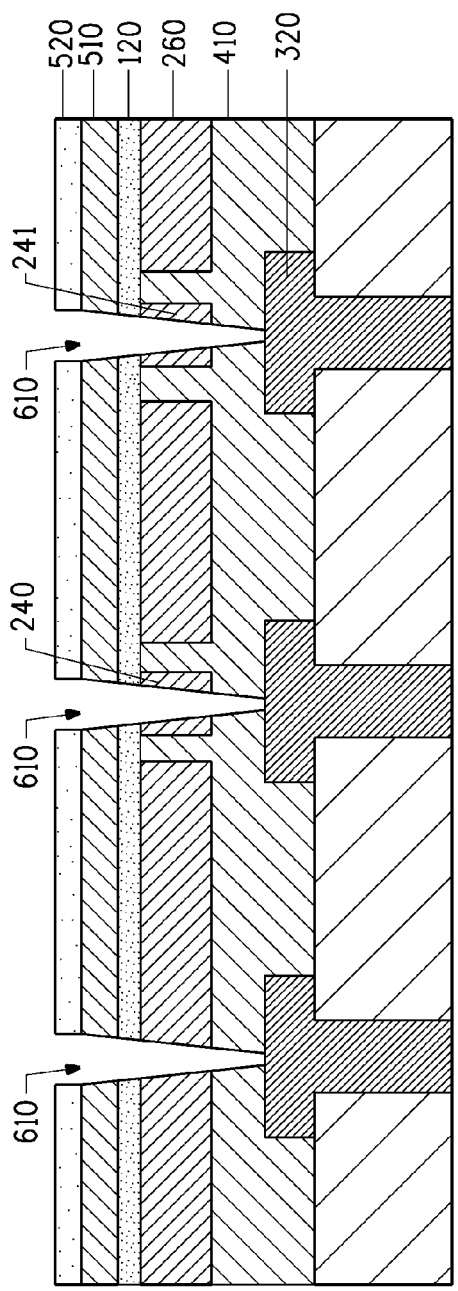
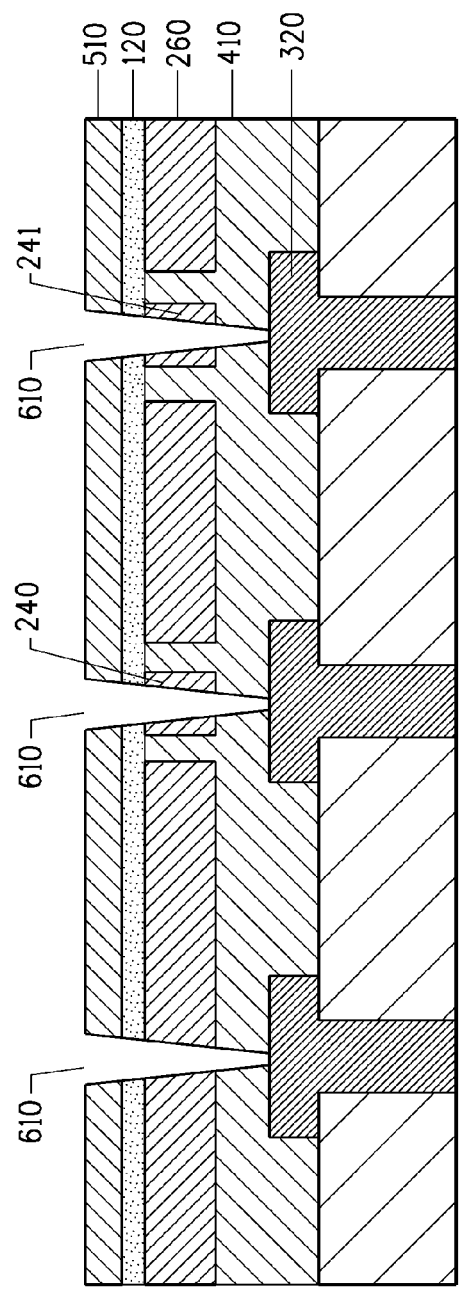
FIG. 6A
FIG. 6B

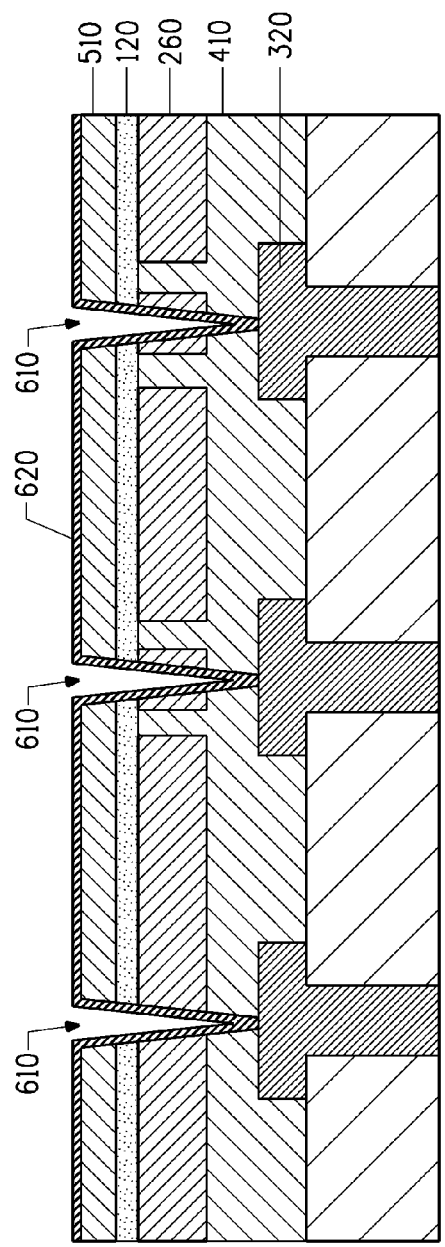
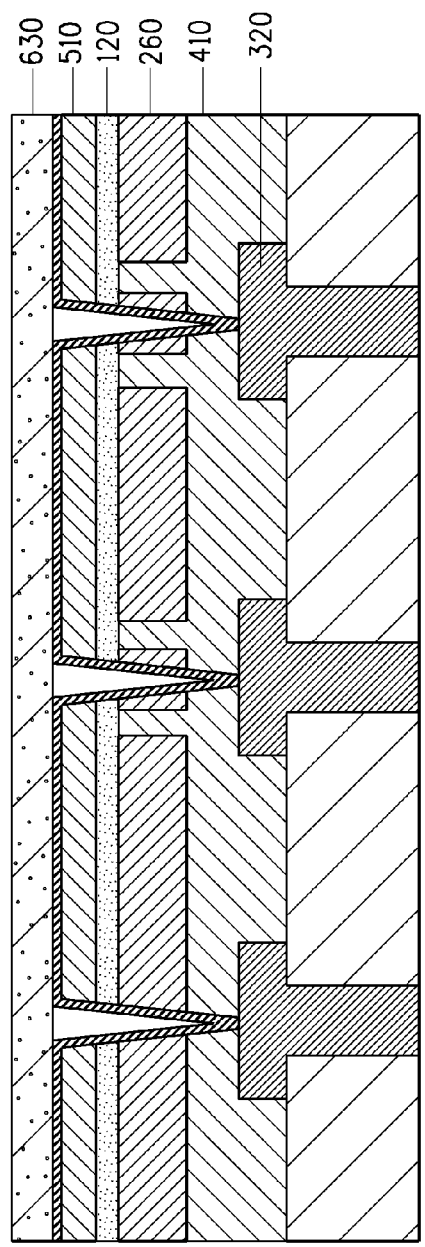
FIG. 6C
FIG. 6D

THIN-FILM CAPACITOR STRUCTURES EMBEDDED IN SEMICONDUCTOR PACKAGES AND METHODS OF MAKING Priority is claimed to U.S. Provisional Application No. 61/173,368 filed on Apr. 28, 2009, which is herein incorporated by reference.

TECHNICAL FIELD

The invention is in the field of thin-film capacitors formed on metallic foils, methods of incorporating such thin-film capacitors into the build-up layers of a package for a semiconductor, packages in which such thin-film capacitors are embedded and which packages can provide a low inductance electrical path for power delivery to a semiconductor device.

BACKGROUND OF THE INVENTION

As semiconductor devices including integrated circuits (IC) operate at higher frequencies, higher data rates and lower voltages, the need to reduce noise in the power and ground (return) lines, the need to supply sufficient current to maintain the power level, and the need to accommodate faster circuit switching become increasingly important issues. These needs require low impedance in the power distribution system. In order to reduce noise and provide stable power to the IC, impedance in conventional circuits is reduced by the use of additional surface mount technology (SMT) capacitors interconnected in parallel. The higher operating frequencies (higher IC switching speeds) and shorter rise times mean that response times of the power delivery network supplying power to the IC must be faster. Lower operating voltages require that allowable voltage variations (ripple) and noise become smaller. For example, as a microprocessor IC switches and begins an operation, it calls for power to support the switching circuits. If the response time of the voltage supply is too slow, compared to the rise time of the signal, the microprocessor will experience a voltage drop or power droop that will exceed the allowable ripple voltage and noise margin and the IC will malfunction. Additionally, as the IC powers up, a slow response time will result in power overshoot. Power droop and overshoot must be controlled within allowable limits by the use of capacitors that are close enough to the IC that they provide or bypass power within the appropriate response time.

For ICs mounted on the surface of a printed wiring mother board, SMT capacitors for impedance reduction and dampening power droop or overshoot are generally placed on the surface of the board as close to the IC as possible to improve circuit performance. Conventional designs have capacitors surface mounted on a printed wiring board (PWB) clustered around the IC. Large value capacitors are placed near the power supply, mid-range value capacitors at locations between the IC and the power supply and small value capacitors very near the IC.

High power and high frequency ICs are generally mounted on a semiconductor package. The semiconductor package is generally only somewhat larger than the IC or ICs. The semiconductor package, complete with mounted ICs, is conventionally mounted to a larger printed wiring mother board or daughter card. In this situation, large and medium value capacitors may reside on the printed wiring mother board or daughter card to which semiconductor package is attached. There is, however, a limitation to the number of SMT chip capacitors that can be mounted in parallel on a semiconductor package.

As IC frequencies increase and operating voltages continue to drop, increased power must be supplied at faster rates requiring increasingly lower impedance levels. Impedance decreases with decreasing inductance and increasing capacitance. Hence it is necessary to minimize the inductance of the interconnection between the capacitors and the IC.

U.S. Pat. No. 6,611,419 to Chakravorty discloses that power supply terminals of an integrated circuit die can be coupled to the respective terminals of at least one embedded capacitor in a multilayer ceramic substrate. U.S. Pat. No. 7,029,971 discloses thin film dielectric for capacitors fired on metallic foils for incorporation into printed wiring boards and the problems with oxidation that arise when high dielectric constant dielectrics are fired on copper foils at elevated temperatures. U.S. Patent Application US20080316723A1 to Borland et al. discloses methods for incorporating high capacitance thin-film capacitors into the build-up layers of a printed wiring board, such as a semiconductor package. The thin film capacitors may be formed on copper or nickel foils.

Forming ceramic capacitors on a nickel foil has the advantage that nickel is much more resistant to oxidation during heated dielectric prefiring steps and during dielectric firing. However, nickel foils do not adhere well to photoresists or organic build up materials used in making semiconductor packages. Nickel foils also have poor high frequency signal propagation properties compared to copper foils. Thin nickel foils are also difficult to handle during processing, but when thicker nickel foils are used, it becomes difficult to accurately laser drill interconnection vias in the capacitors being embedded in a semiconductor package. Finally, when one of the metal layers of a thin-film capacitor is a nickel foil and another layer copper, processing and delamination problems result.

Accordingly, improved methods of incorporating a thin-film capacitor into a semiconductor package wherein the thin-film capacitor is formed on nickel foil are needed.

SUMMARY

A method of making a semiconductor package is disclosed that includes the steps of providing a fired-on-foil thin film capacitor having a first electrode comprising a nickel foil, a second electrode that is a copper electrode, and a thin-film dielectric between the first and second electrodes, wherein the nickel foil has an initial thickness in the range of 10 to 75 micrometers; patterning the second electrode; providing a PWB core and build-up material; positioning the build up material between the patterned second electrode and the PWB core; attaching the patterned second electrode of the thin-film capacitor to said PWB core by way of said build-up material; thinning the nickel foil of the first electrode to provide a nickel foil having a thickness of less than the nickel foil initial thickness, wherein the thinned nickel foil has a thickness in the range of from 2 to 12 micrometers; and in any order, forming microvias through the thinned nickel foil first electrode and the thin-film dielectric, forming at least one additional layer over the thinned nickel foil first electrode, and patterning the thinned nickel foil first electrode.

The build-up material may be an epoxy resin, and the build up material is cured to attach the patterned second electrode of the thin-film capacitor to said PWB core.

Thinning the nickel foil of the first electrode may be conducted by a process selected from abrasion, etching, electropolishing, and combinations thereof. Forming microvias through the thinned nickel foil first electrode and the thin-film dielectric may be conducted by laser drilling, and is preferably performed with a UV laser. In one embodiment, the microvias are laser drilled prior to the forming of at least one additional layer over the thinned nickel foil first electrode, and prior to the patterning of the thinned nickel foil first electrode. In another embodiment, a temporary organic protector sheet is applied over the thinned nickel foil first electrode prior to laser drilling, and the temporary organic protector sheet is removed prior to the formation of additional layers over the thinned nickel foil first electrode.

The fired-on-foil thin film capacitor may be formed by applying a dielectric precursor layer to the nickel foil of the initial thickness, firing the dielectric precursor layer and nickel foil at a temperature in the range of from about 700° C. to about 1400° C. and in an atmosphere having a partial pressure of oxygen in the range of $10^{-7}$ to $10^{-15}$ to form the thin-film dielectric, and applying the second electrode to said thin-film dielectric on a side of the thin-film dielectric opposite to the nickel foil.

I another disclosed embodiment, a method of making a semiconductor package comprises: providing a fired-on-foil thin film capacitor having a first electrode comprising a nickel foil, a second electrode that is a copper electrode, and a thin-film dielectric between the first and second electrodes; patterning the second electrode; providing a PWB core and build-up material; positioning the build up material between the patterned second electrode and the PWB core; attaching the patterned second electrode of the thin-film capacitor to the PWB core by way of the build-up material; forming microvias through the nickel foil first electrode and the thin-film dielectric; depositing a first copper layer on to the nickel foil first electrode and into the microvias; applying a photoresist on the deposited copper layer, imaging and developing the photoresist to expose portions of the first copper layer; and depositing a second copper layer on to exposed portions of the first copper layer not covered by the photoresist.

The disclosed method may further comprise the steps of removing the photoresist around which the second copper layer is formed, and etching the first copper layer and the nickel foil so as to pattern the second copper layer, first copper layer and nickel foil to form a plurality of signal pads corresponding to the microvias into which copper is deposited. The semiconductor package preferably has at least one of the signal pad that is electrically isolated from the first and second electrodes and is electrically connected through the thin-film dielectric to the PWB core. The semiconductor package also has at least one signal pad that is electrically connected to the second electrode and electrically isolated from the first nickel foil electrode.

In one disclosed embodiment, the first copper layer is deposited on to the nickel foil first electrode by electroless deposition, and may have a thickness in the range of from about 100 nanometers to about 500 nanometers. The second copper layer may be deposited by electrolytic deposition, and the second copper layer may have a thickness in the range of from about 2 to 35 micrometers. In one disclosed embodiment, the first and second copper layers and the nickel foil are patterned to form a 50 Ohm impedance circuit trace.

A semiconductor package is also disclosed that comprises: a fired-on-foil thin film capacitor having a first electrode comprising a nickel foil, a second electrode that is a copper electrode, and a thin-film dielectric between the first and second electrodes, wherein the nickel foil has a thickness in the range of 2 to 12 micrometers; a PWB core; build-up material positioned between the second electrode of the fired-on-foil thin film capacitor and the PWB core wherein the build-up material attaches the second electrode to the PWB core; microvias formed through the thinned nickel foil first electrode and the thin-film dielectric of the fired-on-foil thin film capacitor; a copper layer formed on to the nickel foil first electrode and in the microvias; and at least one additional layer over the copper layer formed on the nickel foil first electrode.

In one embodiment, power and ground terminals of at least one semiconductor device are connected to the first and second electrodes respectively (or vice versa) of the thin-film capacitor, and the connections between the thin-film capacitor and the semiconductor device provide a low inductance/impedance path to transfer charge to and from the semiconductor device.

The at least one thin-film capacitor is preferably placed at least 1 layer below a top metal layer of the semiconductor package. The first electrode of the at least one thin-film capacitor may comprise a thinned nickel foil having a thickness in the range of 5 to 10 micrometers. The thin-film dielectric between the first and second electrodes may be a high K thin-film ceramic selected from materials comprising the general formula $ABO_3$ selected from the group $BaTiO_3$; $BaSrTiO_3$; $PbTiO_3$; $CaTiO_3$; $PbZrO_3$; $BaZrO_3$; $Pb(Mg_{1/3}Nb_{2/3})O_3$; $Pb(Zn_{1/3}Nb_{2/3})O_3$ and $SrZrO_3$ or mixtures thereof. The dielectric layer of the at least one thin-film capacitor has a thickness in the range of 0.2 micrometers to 2 micrometers.

The semiconductor package may have signal pads that are electrically connected through the thin-film dielectric to the PWB core, wherein the signal pads are electrically isolated from the first and second electrodes of the thin-film capacitor. In a disclosed embodiment, metal pads on each surface of the thin-film dielectric surround microvias.

Also disclosed is a semiconductor package comprising: a fired-on-foil thin film capacitor having a first electrode comprising a nickel foil, a second electrode that is a copper electrode, and a thin-film dielectric between said first and second electrodes; a PWB core; build-up material positioned between the second electrode of the fired-on-foil thin film capacitor and the PWB core wherein the build-up material attaches the second electrode to the PWB core; microvias formed through the nickel foil first electrode and the thin-film dielectric of the fired-on-foil thin film capacitor; a first electroless copper layer formed on to the nickel foil first electrode and in the microvias; a second electroplated copper layer formed on the first electroless copper layer; and at least one additional layer over the copper layer formed on the nickel foil first electrode.

Those skilled in the art will appreciate the above stated advantages and other benefits of various additional embodiments and aspects of this disclosure upon reading the following detailed description.

According to common practice, the various features of the drawings are not necessarily drawn to scale. Dimensions of various features may be expanded or reduced to more clearly illustrate the embodiments of the invention.

BRIEF DESCRIPTION OF THE DRAWINGS

The detailed description will refer to the following drawings, wherein like numerals refer to like elements, and wherein:

FIG. 1C is a sectional view of the thin-film fired-on-foil capacitor taken along the line 1C-1C in the plan view of FIG. 1D.

FIGS. 2A-2I illustrate plating and patterning the second electrode of the thin-film capacitor of FIGS. 1C and 1D. FIG. 2B depicts a single capacitor as indicated in FIG. 2A. FIG. 2F is a sectional view taken along the line 2F-2F of the plan view of FIG. 2G. FIG. 2H is a sectional view taken along the line 2H-2H in the plan view of FIG. 2I.

FIGS. 5A-5B illustrate in section view steps wherein a first electrode comprising nickel foil of a thin-film capacitor is thinned and a temporary organic protector sheet is applied to the thinned nickel foil.

FIGS. 6A-6J illustrate laser drilling microvias, removal of a temporary organic protector sheet and electroless and electrolytic deposition of copper into the microvias and onto the surface of a thinned nickel foil. FIG. 6G is a sectional view taken along the line 6G-6G of the plan view of FIG. 6H. FIG. 6I is a sectional view taken along the line 6I-6I in the plan view of FIG. 6J.

FIGS. 9A-9G illustrate in section view structures that are used for electrical simulation to evaluate designs of the current invention.

DETAILED DESCRIPTION

Figure 1A:
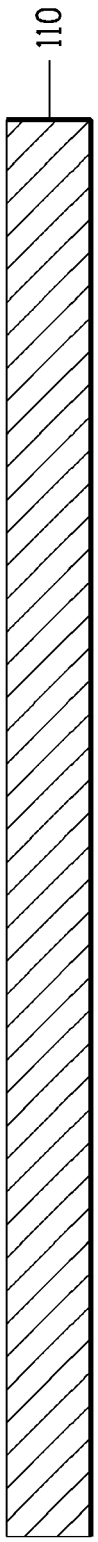
FIGS. 1A-1D illustrate a method of making thin-film fired-on-foil capacitors wherein a first electrode comprises nickel foil and a second electrode is also provided.

The detailed description discusses the inventions recited in the claims with reference to the following defined terms:

As used herein, the term "embedding" refers to placing, positioning or integrating capacitors or other components within the build-up layers of a semiconductor package or printed wiring board.

As used herein, the term "thin-film capacitor" refers to a capacitor wherein the dielectric comprises a high dielectric constant material and the dielectric thickness is in the range of approximately 0.2 to 2.0 micrometers.

As used herein, the term "fired-on-foil thin-film capacitors" refers to capacitors that are formed by: (1) firing at an elevated temperature a dielectric layer deposited onto a metallic foil in order to crystallize and sinter the dielectric, which forms a high dielectric constant thin-film; and (2) depositing a top electrode before or after firing the dielectric.

As used herein, the term "high dielectric constant" or "high K capacitor dielectric materials" refers to materials that have a bulk dielectric constant above 500. High K capacitor dielectric materials include perovskite-type ferroelectric compositions with the general formula $ABO_3$. Examples of such compositions include $BaTiO_3$; $BaSrTiO_3$; $PbTiO_3$; $CaTiO_3$; $PbZrO_3$; $BaZrO_3$ and $SrZrO_3$ and mixtures thereof. Other high K dielectric constant material compositions are also possible by substitution of alternative elements into the A and/or B position, such as $Pb(Mg_{1/3}Nb_{2/3})O_3$ and $Pb(Zn_{1/3}Nb_{2/3})O_3$ and mixed metal versions of the above compositions.

As used herein, the term "patterning", "to pattern" or "patterned" refers to the process or result of the process, common in the printed wiring board industry, of applying a photoresist to a metal foil or layer, imaging and developing the photoresist to selectively remove portions of the photoresist to expose the underlying metal, and removing the exposed metal by etching.

As used herein, a "common electrode" refers to a continuous capacitor electrode that functions as 2 or more electrodes of the same polarity for 2 or more capacitors.

As used herein, the term "semiconductor package" refers to a printed wiring board [PWB] that is small in area, an interposer, a multichip module, an area array package, a system-on package, a system-in-package, and the like, or a device used as such.

As used herein, the term "build-up material" refers to any of a number of organic dielectric materials common to the printed wiring board industry that are in a B-stage or not fully cured state that can be used to cover and encapsulate a conductive layer, act as a dielectric separation between conductive metal layers, or bond two conductive layers together. During, or after covering, encapsulating, separating or bonding, the build-up material is cured by heat and or pressure. The build-up material is typically comprised of an epoxy resin. An example of a build-up material used in the printed wiring board industry is ABF GX-13 available from Ajinomoto Fine-Techno Co., Inc. Build-up material is a generic term and can include any reinforced or non-reinforced B-stage resin system used in the printed wiring board industry.

As used herein, the term "core", "PWB core" or "PWB laminated core" refers to a printed wiring board structure that is formed in a lamination from a number of inner layer PWB panels. The term is used generically to indicate the starting point or a base for additional metal/dielectric layers that are built up or sequentially added to the core to form a semiconductor package.

As used herein, the term "printed wiring motherboard", "PWB motherboard" or "daughter board" refers to a large printed wiring board that the semiconductor package, as defined above, is generally placed on and interconnected to.

As used herein, the term "integrated circuit" or "IC" refers to a semiconductor chip, for example, a microprocessor, a transistor set, logic device, etc.

As used herein, the term "plurality" means more than one.

As used herein, the term "known good capacitor" refers to a capacitor that has been tested and is known to be functioning within predetermined specifications.

Disclosed is a semiconductor package comprising: at least one thin-film capacitor embedded into at least one build-up layer of a semiconductor package; wherein the at least one thin-film capacitor has a first electrode comprising copper-coated nickel and a second electrode comprising copper or a copper alloy; wherein the power and ground terminals of at least one semiconductor device are connected to the first and second electrodes respectively (or vice versa) of the thin-film capacitor; and wherein the signal terminals of at least one semiconductor device are connected to signal pads of the semiconductor package that are electrically isolated from the first and second electrodes; and wherein the interconnections between the thin-film capacitor and the semiconductor device provide a low inductance/impedance path to transfer charge to and from the semiconductor device.

One disclosed embodiment comprises a capacitor structure that includes a copper-coated, thinned nickel foil first electrode, a fired-on-foil thin-film dielectric and a copper second electrode placed at least one layer below a top metal layer of the semiconductor package. In another disclosed embodiment, circuitry is fabricated from the copper-coated, thinned nickel foil.

Also described herein are methods of making a semiconductor package comprising at least one thin-film capacitor embedded into at least one build-up layer of the semiconductor package; wherein the at least one thin-film capacitor has a first electrode comprising copper-coated nickel and a second electrode comprising copper; wherein the power and ground terminals of at least one semiconductor device can be connected to the first and second electrodes respectively (or vice versa) of the thin-film capacitor; and wherein the signal terminals of at least one semiconductor device can be connected to the signal pads in the semiconductor package that are electrically isolated from the first and second electrodes; and wherein the interconnections between the thin-film capacitor and the semiconductor device provide low inductance/impedance paths to transfer charge to and from the semiconductor device.

One embodiment of the methods disclosed comprises laminating the patterned second electrode side of the thin-film capacitor to a build-up layer of a semiconductor package and thinning the nickel foil first electrode. Another embodiment comprises applying a temporary organic protector sheet over the thinned nickel foil first electrode. Another embodiment comprises laser drilling microvias through the temporary organic protector sheet, the thinned nickel foil first electrode and the thin-film dielectric. Yet another embodiment comprises depositing a copper coating on the thinned nickel foil first electrode and into the microvias, and yet another embodiment comprises patterning the copper-coated, thinned nickel foil first electrode to form a common first electrode for a plurality of capacitors. Yet another embodiment comprises patterning the copper-coated thinned nickel foil to form circuit traces.

Photoresists and organic build-up materials used in manufacturing semiconductor packages do not adhere well to nickel foils. However, semiconductor packages constructed according to the above methods provide for good photoresist adhesion to the copper-coated, thinned nickel foil first electrode side of the thin-film capacitor thereby allowing accurate patterning of the copper-coated, thinned nickel foil first electrode. Semiconductor packages constructed according to the above methods also provide for good adhesion of the copper-coated, thinned nickel foil first common electrode to subsequently added build-up material. The methods described herein also allow for rapid, accurate and consistent laser drilling through the thin-film capacitor. The methods also allow for protection of the first electrode from debris ejected from the microvias during laser drilling. Additionally, copper deposited on the thinned nickel first electrode eliminates the known detrimental effects on high frequency signal propagation due to the presence of thin-film high dielectric constant dielectric layers and nickel layers allowing for circuitry of the desired electrical characteristics to be fabricated from the copper-coated, thinned nickel foil.

FIG. 1A-1D illustrate a method of making a thin-film fired-on-foil capacitor 100. Thin-film fired-on-foil capacitors are known. For example U.S. Pat. No. 7,029,971 to Borland et al., discloses methods of making fired-on-foil thin-film capacitors. In FIG. 1A, a foil 110 is provided. Foil 110 comprises nickel and will become the first electrode of a fired-on-foil capacitor. As used herein, "nickel foil" refers to thin metal sheet or leaf comprised of nickel, nickel alloys or combinations thereof, wherein nickel comprises at least 75 wt. percent of the foil metal, and more preferably of at least 90 wt. percent of the foil metal, and most preferably of at least 98 wt. percent of the foil metal. Nickel foil is used because of its resistance to oxidation at the elevated burn out and firing temperatures to which the high K ceramic dielectric material of the thin-film capacitors are subjected. In one preferred embodiment, the thickness of foil 110 is in the range of from about 10 to about 75 micrometers, and more preferably in the range of from about 20 to about 55 micrometers. The use of thicker nickel foils within this thickness range is especially useful for handling during subsequent processing as such nickel foil is quite resistant to buckling, distortion and the like. An example of a suitable nickel foil is 25 micrometer thick Nickel Foil 270 obtainable from Hamilton Precision Metals of Lancaster, Pa. In another embodiment, a thinner nickel foil film with a thickness in the range of 5 to 10 micrometers is used, but the processing of such a thin nickel foil through the thin-film capacitor fabrication process requires very careful film handling in order to avoid wrinkling or buckling the film.

Figure 1B:
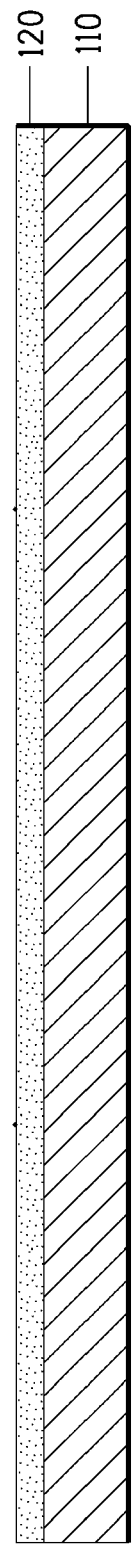

In FIG. 1B, a capacitor dielectric precursor material is deposited onto the nickel foil 110 to form capacitor dielectric precursor layer 120. A high capacitance density capacitor can be achieved by use of a precursor for a high K capacitor dielectric material. High dielectric constants are well known in ferroelectric ceramics. Ferroelectric dielectric materials with high dielectric constants include perovskites of the general formula $ABO_3$ in which the A site and B site can be occupied by one or more different metals. For example, high K dielectric material is realized in crystalline barium titanate (BT), lead zirconate titanate (PZT), lead lanthanum zirconate titanate (PLZT), lead magnesium niobate (PMN) and barium strontium titanate (BST). Barium titanate based compositions are particularly useful as they have high dielectric constants and they are lead free.

The capacitor dielectric material may be deposited, for example, by coating the nickel foil with a chemical solution of a suitably high dielectric constant material (i.e., chemical solution deposition or "CSD"). CSD techniques are desirable due to their simplicity and low cost. Other methods of depositing the thin-film dielectric include sputtering, laser ablation, chemical vapor deposition or combinations thereof. The initial deposition composition is either amorphous or crystalline depending upon deposition conditions. Amorphous compositions have low K (approximately 20) and have to be annealed at high temperatures to induce crystallization and produce the desired high K phase. The high K phase in barium titanate based dielectrics can be achieved when grain sizes exceed 0.1 micron and so annealing temperatures as high as 900° C. may be used. A barium titanate CSD composition is disclosed in U.S. Patent Publication No. 2005-001185. The precursor composition consists of barium acetate, titanium isopropoxide, acetylacetone, acetic acid and methanol.

The capacitor dielectric material layer 120 is subjected to drying, burnout and firing steps to densify and crystallize the dielectric precursor layer. A suitable firing temperature is in the range of from about 700° C. to about 1400° C., and is more preferably in the range of from about 800° C. to about 1200° C., and may be approximately 900° C. Firing may be conducted under a protective atmosphere sufficiently low in oxygen to help protect the nickel foil from oxidation. An atmosphere having a partial pressure of oxygen in the range of $10^{-7}$ to $10^{-15}$, and more preferably in the range of $10^{-9}$ to $10^{-12}$, helps to protect the nickel foil against oxidation. A firing temperature of approximately 900° C. in an atmosphere having a partial pressure of oxygen in the range of $10^{-9}$ to $10^{-12}$ has been advantageously used in the firing of capacitors having a barium titanate dielectric on a nickel foil.

Figure 1C:
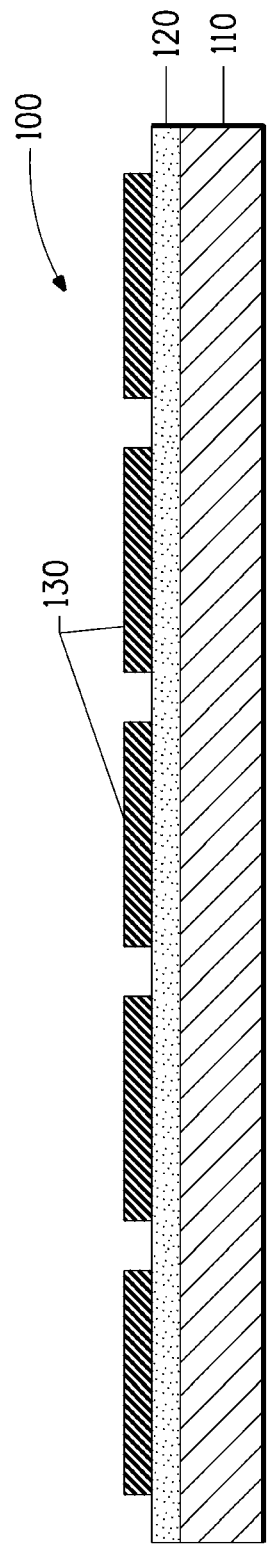

In FIG. 1C, second electrodes 130 are formed over fired dielectric layer 120 to form capacitors by, for example, sputtering or other methods such as laser ablation, chemical vapor deposition or combinations thereof. Thickness of sputtered second electrode 130 is in the range of from 0.1 micrometer to 5 micrometers, and more preferably in the range of from 0.5 micrometer to 3 micrometers. The second electrodes 130 are preferably comprised of copper, a copper alloy or combinations thereof. As used herein, the term "copper electrode" refers to electrodes comprised of at least 60 wt. percent copper, more preferably of at least 85% wt. percent copper, based on the weight of the total metal in the electrode.

Figure 1D:
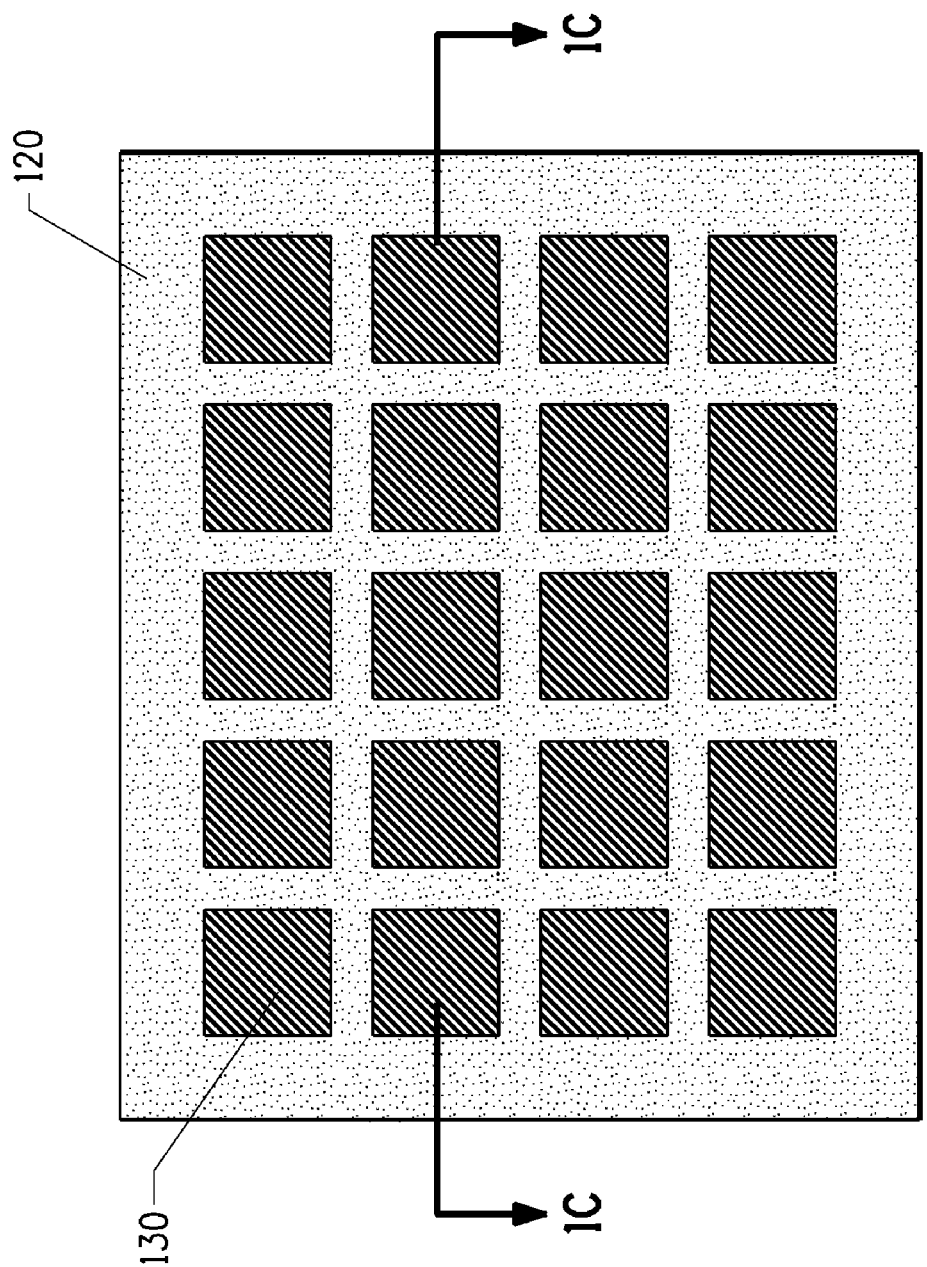

FIG. 1D is a plan view of the fired-on-foil, thin-film capacitors shown in the cross-section of FIG. 1C. Twenty large capacitors are shown, each having second copper electrode 130 on dielectric layer 120 on nickel foil 110 (the foil is not shown due to 100% dielectric coverage). Any number of large capacitors, from one to several hundred, for example, can be formed on foil 110.

At this stage, the fired-on-foil, capacitors can be tested for capacitance and other properties. Testing identifies the locations of known good capacitors. For example, each foil may be divided into a grid of subparts, each subpart having a unique address, thereby uniquely identifying the location of each large capacitor. If a tested large capacitor is found to be shorted or otherwise defective, because its location is known, in the final assembly of the semiconductor package, the defective capacitor can be electrically not connected to the semiconductor device on the package. If the yield of large capacitors on the foil is low, the foil containing the fired-on-foil large capacitors can be discarded. This allows for high yield in the final product.

Figure 2H:
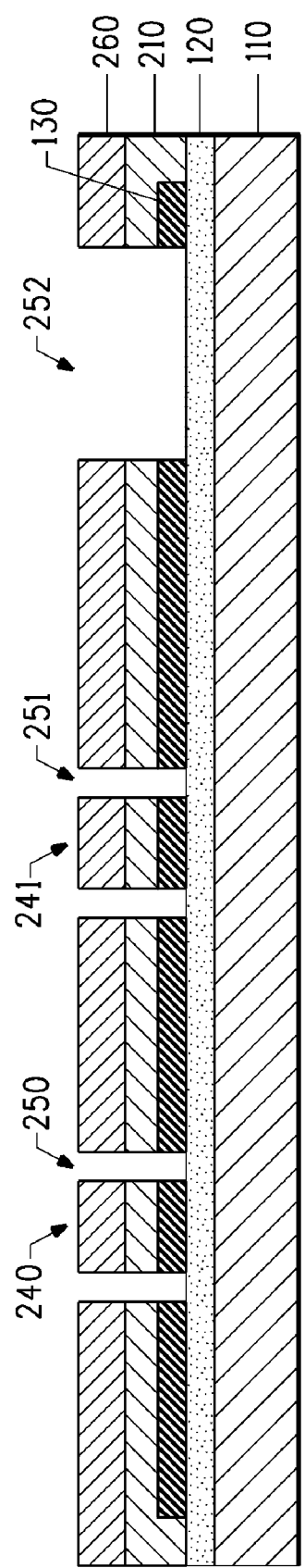

FIGS. 2A-2I illustrate a method of patterning the copper second electrode side of the thin-film fired-on-foil capacitors. In FIG. 2A, additional copper is added to the copper second electrode 130 side of the thin-film fired-on-foil capacitors to form metal layer 210. This may be accomplished, for example, by sputtering to the desired thickness. Other methods of adding the additional copper to form metal layer 210, such as plating, may also be practiced. The thickness of metal layer 210 is preferably in the range of from 0.3 to 15 micrometers, and more preferably in the range of from 0.5 to 3 micrometers. For clarity, FIGS. 2A-2F and FIG. 2H separately show in cross section the second electrode 130 even though in practice, it is now incorporated into metal layer 210.

FIG. 2B, depicts the single capacitor highlighted in FIG. 2A in expanded detail for additional clarity for the next stages of the fabrication process. The application of a photoresist layer 220 to the metal layer 210 is also shown in FIG. 2B.

Referring to FIG. 2C, the photoresist is imaged and developed to remove photoresist and form openings 225 around photoresist features 224. In FIG. 2D, copper is electroplated into the openings 225 to form copper layer 230 which increases the thickness of the copper to a thickness in the range of from 5 to 20 micrometers and more preferably to a thickness in the range of from 10 to 15 micrometers.

Referring to FIG. 2E, the remaining photoresist features 224 are stripped to form openings 235 and 236 and expose the underlying copper layer 210 that was protected by the photoresist 224 during electroplating. Referring to FIG. 2F, the copper layer 210 and the underlying second electrode layer 130 are now flash etched to remove the exposed copper down to the dielectric layer 120. This creates isolated copper pads 240 and 241 surrounded by annular rings 250 and 251 and a common second electrode 260. FIG. 2G is a plan view of the article of FIG. 2F showing the pads 240 and 241 and annular rings 250 and 251 formed around the pads 240 and 241. The line 2F-2F in FIG. 2G depicts where the cross-sections of FIGS. 2B-2F are drawn. In FIG. 2G, six pads and annular rings are shown on the one large area capacitor but any number of pads and annular rings may be fabricated depending on the number of power and ground and signal terminals of the semiconductor device that are to be connected to the capacitor. Other designs may also be fabricated that use shapes other than annular rings, such as annular squares, rectangles, or more complex annular shapes.

Figure 2I:
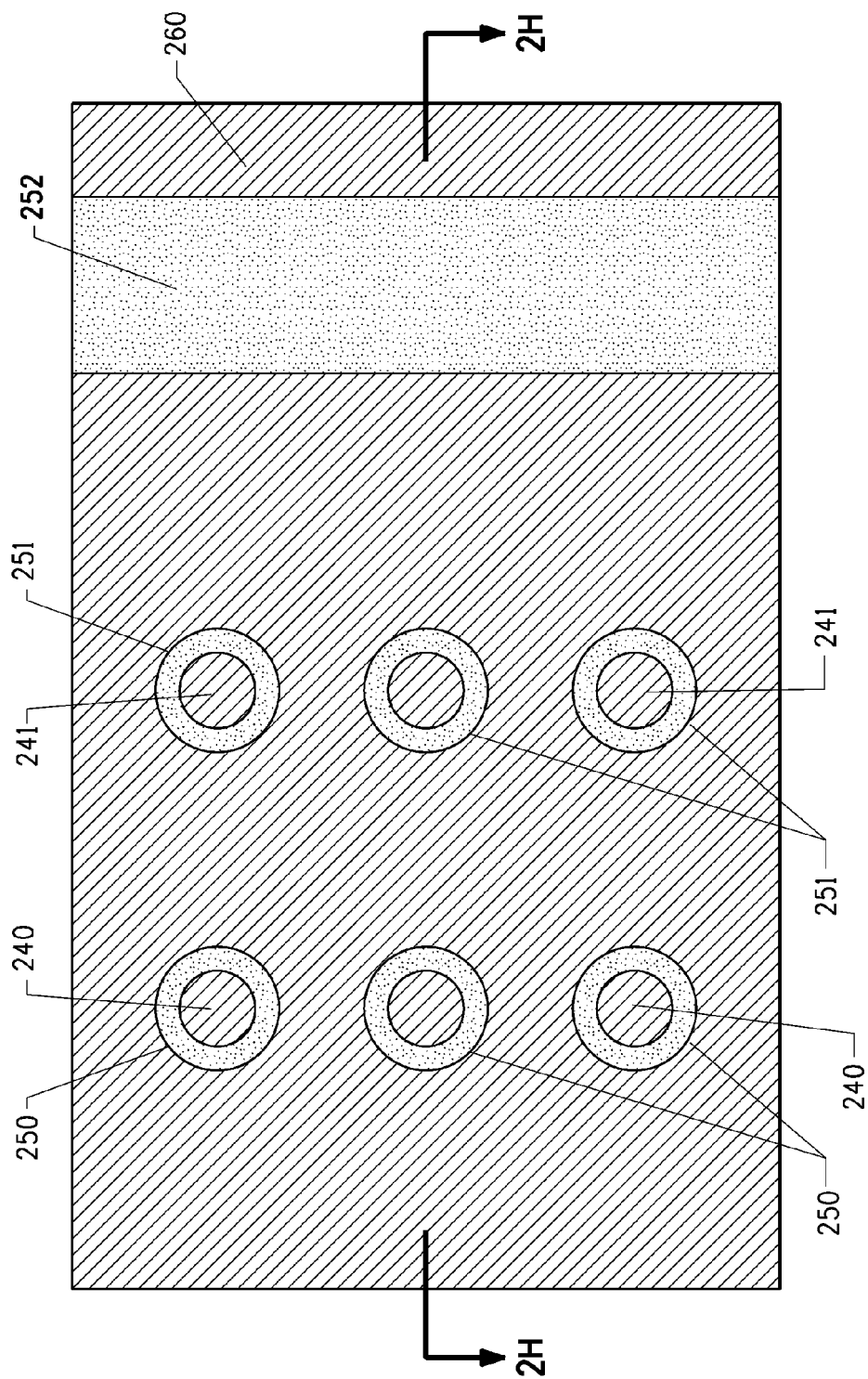

While not contained in the prior description, the design of the article of FIGS. 2F and 2G may be modified to allow for circuitry to be incorporated into the same plane as the capacitor. Such circuitry would be isolated from the capacitor structures and may be fabricated from metal layers including the foil 110 as described below with the description of FIGS. 6I and 6J. In FIGS. 2H and 2I, a modified design of the article of FIGS. 2F and 2G to allow for such circuitry is shown. In FIG. 2H, the second electrode is completely removed in the area where circuitry will be fabricated from metal layers comprising foil 110 by forming a trench 252 at the same time that the annular rings 250 and 251 are formed. Removal of the second electrode in the area where circuitry will be fabricated avoids capacitive effects on the circuitry. FIG. 2I is a plan view of the article of FIG. 2H showing trench 252. The line 2H-2H depicts where the cross-section of FIG. 2H is drawn. Trench 252 corresponds to the area on the opposite side of the dielectric layer from where circuitry will be fabricated from copper on the nickel foil 110 as described below with the description of FIGS. 6I and 6J. In FIG. 2I, trench 252 is shown as being formed across the full width of the individual large area capacitor 260 but other designs are of course possible depending on the circuitry requirements.

Figure 3:
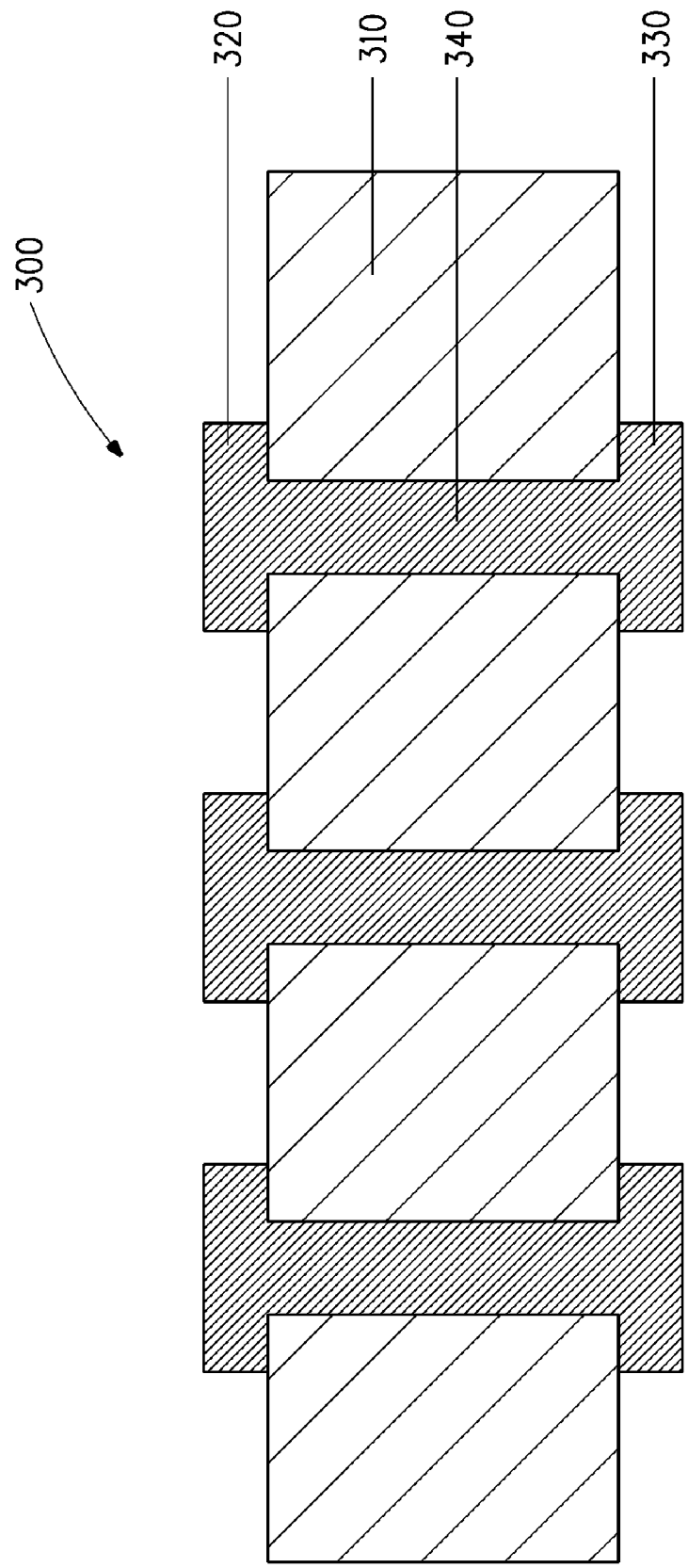
FIG. 3 depicts in section view the structure of a generic printed wiring board core.

In FIG. 3 a core 300 is provided. Core 300 has a central dielectric 310, through hole vias 340 and metal pads 320 and 330 on each side of the dielectric. The core 300 may have additional metal layers and may have additional circuitry on the same layers as metal pads 320 and 330. Through hole vias 340 are shown filled for purposes of clarity but in practice, the vias may be plated to coat the side walls only. Metal pads 320 and 330 are at the location where laser drilled via holes will be later drilled through the build up layers to provide electrical connection from the core metal layer to the build-up metal layers. The pads 320 and 330 also prevent the laser from drilling into the core dielectric 310.

Figure 4A:
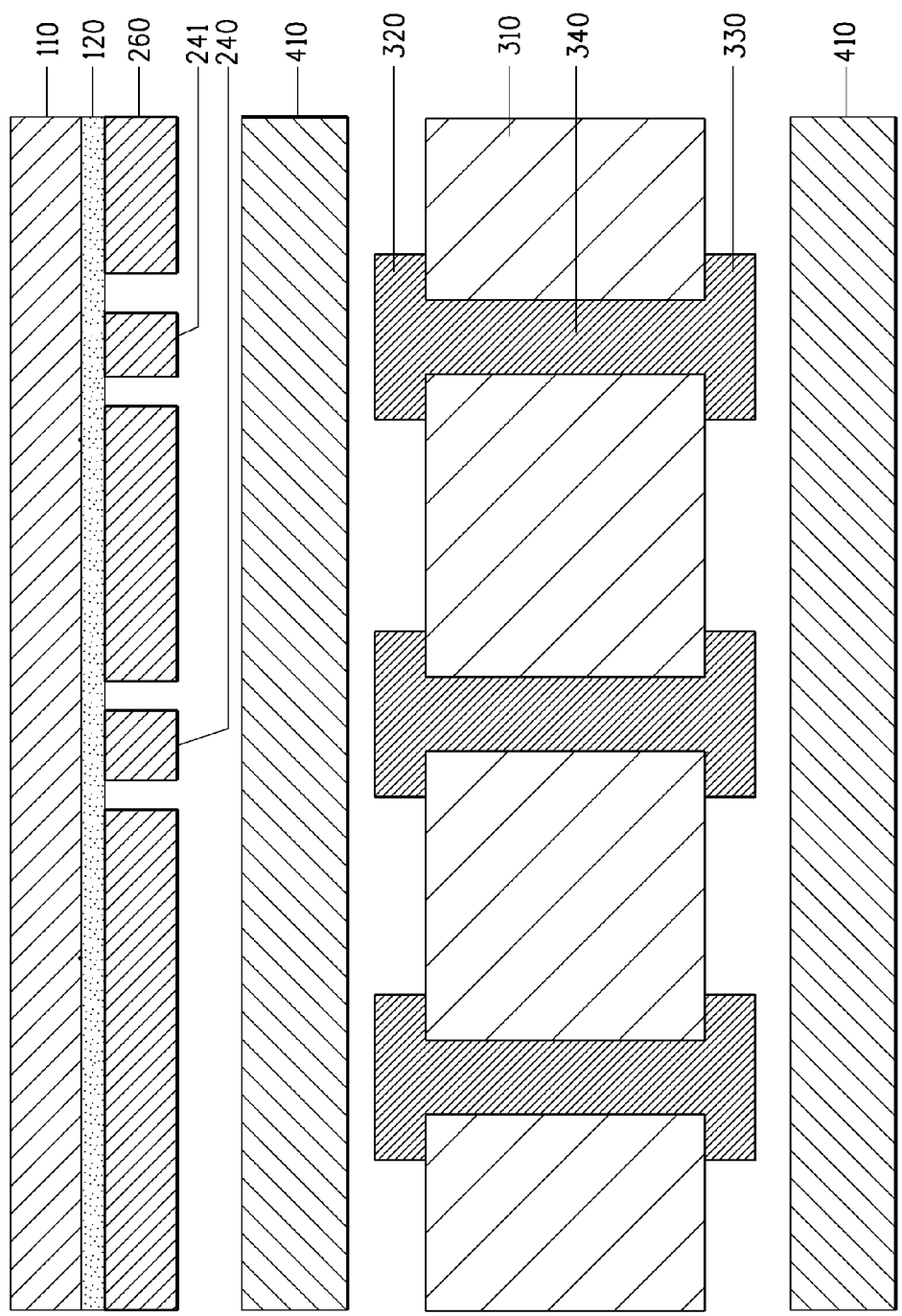
FIGS. 4A-4B illustrate in section view laminating the patterned second electrode side of a thin-film capacitor to a build up layer and a printed wiring board core.
Figure 4B:
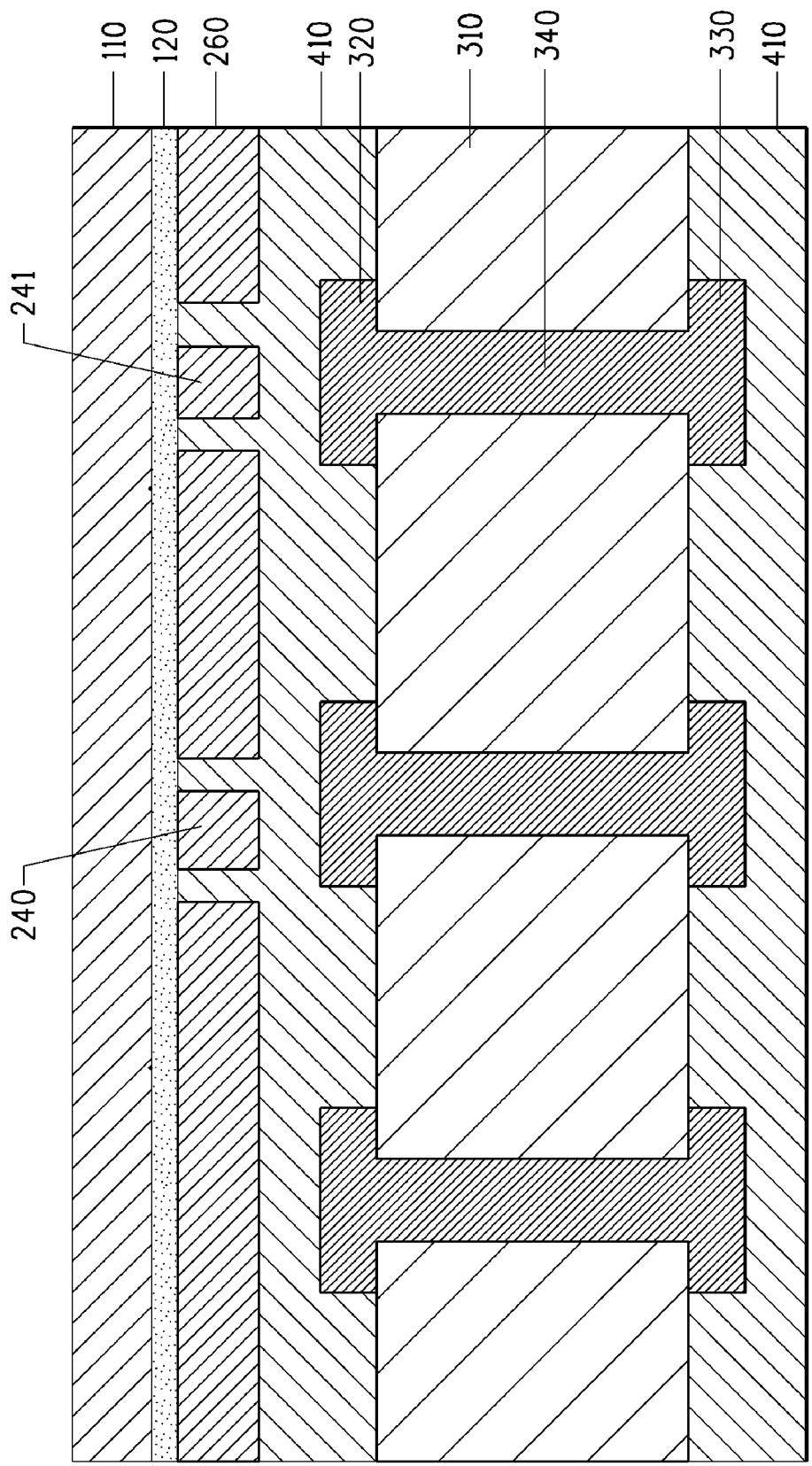

FIGS. 4A-4B illustrate in cross-section view bonding of the thin-film capacitor to the core using a build-up material. For purposes of illustration, the article of FIG. 2F will be used in the ongoing description. Also for purposes of simplicity, the remaining elements of metal layers 130 and 210 are combined into the common second electrode 260 and pads 240 and 241. Prior to bonding, the surfaces of copper pads 240, 241 and copper second electrode 260 may be treated with the application of an oxide treatment or an alternate multilayer bonding chemistry to improve the bond between the copper and the build-up material. Such treatments are known in the printed wiring board industry. It is advantageous during treatment that the first electrode and the second electrode of the thin-film capacitor are shorted together and connected to earth ground. This removes any residual charge on the capacitor prior to or during the application of the treatment, thereby, ensuring a uniform treatment to the surfaces.

In FIG. 4A, B-stage build-up material 410 as defined above is placed on either side of the core 300. The article of FIG. 2F is placed on one or both sides of the core and build-up material stack with common second electrode 260 and pads 240 and 241 facing the build-up material 410 on the core 300. In the example of FIG. 4A, only one article like that of FIG. 2F is shown.

The article of FIG. 2F, build-up material 410 and core 300 are laminated together under heat and pressure to form the article of FIG. 4B. A suitable lamination procedure consists of pressing the components in a lamination press followed by a heating cycle in a nitrogen oven to cure the build-up material 410. Suitable lamination conditions are 30 minutes at a temperature of 120° C. under a pressure of from 200 to 250 pounds per square inch. Suitable heating conditions to cure build-up material 410 are 30 minutes at 120° C. followed by 60 minutes at 170° C.

Subsequent FIGS. 5-8 illustrate only one side of the core for purposes of clarity. Additional layers on the side of the core not shown in the drawings may also be added using processes described herein or other processes common in the printed wiring board industry.

Nickel foil first electrode 110 of FIG. 4B is thinned to form thinned nickel foil first electrode 510 of FIG. 5A. Thinning of the nickel foil 110 may be accomplished by a variety of methods, such as by etching, electropolishing or mechanical abrasion or other known methods for thinning a metal foil. Spray etching is particularly effective. Also effective are abrasion techniques, such as grinding using Ishii Hyoki grinding equipment. The nickel foil 110 is thinned from a thickness in the range of from 10 to 75 micrometers to a thickness in the range of from 2 to 12 micrometers, more preferably to a thickness in the range of from 5 to 10 micrometers to form thinned nickel foil first electrode 510. Thinning the nickel foil reduces the amount of metal that must be removed by the laser during laser drilling of via holes.

Alternatively, thinning of the nickel foil 110 may be eliminated by starting with a foil in the desired final thickness range. However, processing such thin foils through the thin-film fired-on-foil capacitor fabrication process results in poor yield due to distortion of the foil and other defects. Therefore, it is advantageous to fabricate the fired-on-foil capacitor on a relatively thick nickel foil 110 and then reduce its thickness later. A thicker foil 110 allows for easier handling and results in higher yields. Thinning of the foil 110 may also be done before lamination of the capacitor structure to the core. However, after annealing the dielectric, the nickel foil first electrode 110 is flexible and easily distorted if not handled carefully. The thin-film dielectric 120, the thin copper second electrode 130 and the metal layer 210 provide little rigidity to the nickel foil first electrode. Thinning of the foil prior to laminating the capacitor structure to the core using an abrasion method, such as the use of polishing wheels, therefore requires a mechanism for holding the thin-film capacitor flat while the nickel foil first electrode 110 is being thinned. Without such a holding mechanism, the nickel foil 110 will lift off the wheel or wrinkle resulting in uneven polishing or damage to the dielectric. Thinning the nickel foil first electrode 110 after lamination of the second electrode side of the capacitor structure to the core 300 is advantageous because the core 300 adds rigidity and maintains flatness during polishing. Thinning the foil 110 by chemical methods, such as etching or electropolishing, requires protection of the copper second electrode 130, the additional metal layer 210, and/or the dielectric 120 from the etching or electrochemical polishing chemicals and therefore, such chemical methods are also best applied after laminating the capacitor to the core because the lamination process automatically protects the second electrode side of the capacitor from the chemicals.

In FIG. 5B, a thin, temporary organic protector sheet 520 is applied to the thinned nickel foil first electrode 510. The temporary organic protector sheet 520 may be a photoresist or any organic material that will adhere to nickel foil first electrode 510. Organic protector sheet 520 may be applied by laminating a sheet to the surface of thinned nickel foil first electrode 510 or by coating a liquid composition over thinned nickel foil first electrode 510 that will form a sheet when dried and cured. Thickness of the temporary organic protector sheet 520 is preferably in the range of from a few micrometers to fifty micrometers. A particularly effective organic protector sheet is SP 139-6 tape available from PPI Adhesive Products Corp., 1990 Sproul Road, Broomall, Pa.

Figure 6E:
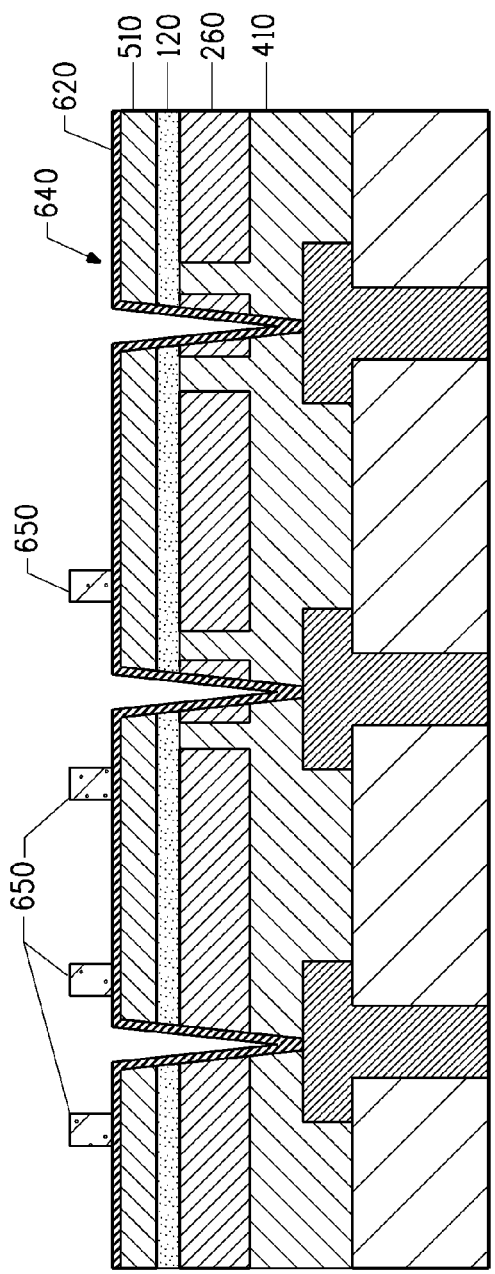

FIGS. 6A-6J illustrate the process of forming conductive microvias and other features and preparing the patterned top metal layer comprising the thinned nickel foil first electrode. In FIG. 6A, microvias 610 are formed. Microvias 610 are preferably formed by UV laser drilling. Other methods for forming the microvias may alternatively be used such as YAG laser drilling or controlled depth mechanical drilling. However, UV laser drilling allows for more precise drilling through metal and organic layers. The microvias 610 are laser drilled through temporary organic protector sheet 520, thinned nickel foil 510, thin-film ceramic dielectric 120, copper pads 240 and 241 and common electrode 260 (as described above) terminating on and exposing areas of copper pads 320. During laser drilling, molten metal may be ejected from the microvia 610 and redeposited on the surface of the temporary organic protector sheet 520. Temporary organic protector sheet 520 prevents any molten metal from coming into contact with thinned nickel foil 510. The drilling of the microvias 610 may also be accomplished without the use of temporary protector sheet 520 if drilling is done in a way to avoid ejection of metal onto the nickel foil or if the ejected metal is otherwise contained. It is also understood by anyone skilled in the art that copper pads 320 need not be on the core but may be pads created on a previously made build-up layer.

Referring to FIG. 6B, temporary organic protector sheet 520 is removed with solvent, UV radiation, washing, or by other known methods. When temporary organic protector sheet 520 is removed after laser drilling, any molten metal deposited on the temporary organic protector sheet will also be removed, leaving the surface of the thin nickel foil 510 free of laser drilling debris. FIG. 6B also illustrates that each laser drilled microvia hole is surrounded by copper metal of metal pads 240 and 241 or copper metal from common electrode 260. Having copper metal surrounding all microvias is advantageous to the process in that the laser drilling always occurs through the metal and therefore, the parameters may be held constant when drilling all microvias 610. Another advantage of the presence of copper surrounding the vias is that dielectric 120 is protected on both sides by metal. An additional advantage of having copper surrounding the microvias is that the interface between the build-up material 410 and the thin-film dielectric 120 is protected from damage by the laser drilling. Such damage could result in a weak bond that could be a starting point for delamination when the printed wiring board is subjected to high temperature excursions during soldering. While having copper metal surrounding the microvias is advantageous to the laser drilling process, it is understood that copper metal surrounding the microvias is not essential.

In FIG. 6C, a thin electroless copper layer 620 is deposited over the surface of the thinned nickel foil 510, into the laser drilled holes 610 and on to the exposed areas of pads 320. Thickness of thin electroless copper layer 620 is preferably in the range of from about 100 nanometers to about 500 nanometers. The electroless copper layer 620 deposited on the thinned nickel foil 510 provides a copper surface. Nickel surfaces have poor adhesion to photoresist resulting in poor definition of features when the photoresist is imaged and developed and the underlying nickel is etched. Copper provides a surface for very good photoresist adhesion and so the presence of the electroless copper 620 is advantageous when patterning the first electrode 510.

Figure 6F:
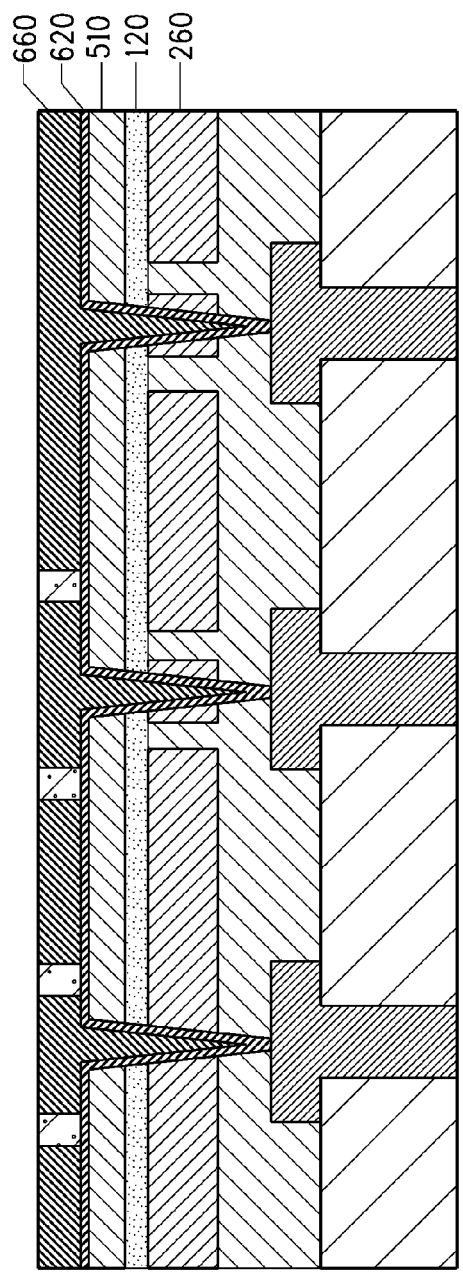

In FIG. 6D, photoresist 630 is applied to the surface of electroless copper layer 620. In FIG. 6E, photoresist 630 is imaged and developed to form openings 640 and photoresist features 650. In FIG. 6F, a copper layer 660 is electroplated onto the surface of electroless copper 620 and into the microvias 610. In one embodiment, the plated copper layer has a thickness of from about 2 to about 35 micrometers, and more preferably in the range of from 5 to 15 micrometers. The electroplated copper layer 660 provides a number of advantages. The plated copper provides for a copper surface that can be treated to develop good adhesion to subsequently applied build-up layers. Plating copper, by electroless and/or electrolytic plating, on the surface of the nickel has advantages in addition to improving photoresist adhesion. Copper provides a surface that can be treated with copper adhesion promotion chemistries such as black oxide or oxide replacement chemistries used in the printed wiring board industry to increase adhesion of the build-up material to the copper. These chemistries do not result in promoting good adhesion of nickel to build-up material. Copper plating on the surface of the nickel provides an additional advantage with respect to signal propagation. Nickel is ferromagnetic and increases the characteristic impedance when nickel is used for signal propagation. Plating copper on the surface of the nickel provides signal line design flexibility, permitting fabrication of 50 Ohm characteristic impedance circuit traces and circuit return paths using combinations of the thin-film capacitor electrodes and the copper layers above and below the thin-film capacitor. The thickness of the copper after electroplating allows for circuit traces to be fabricated without any deleterious electrical effects caused by the underlying nickel foil 510.

Figure 6G:
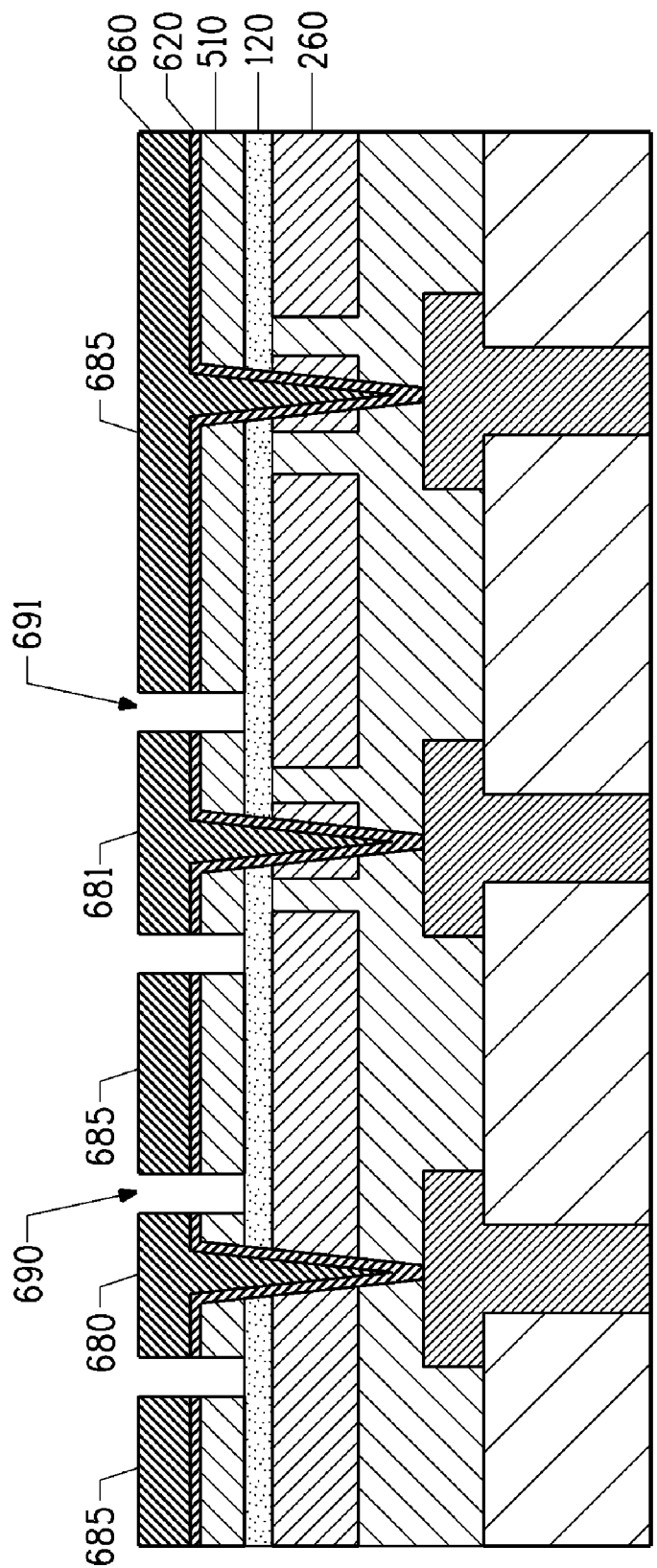
Figure 6H:
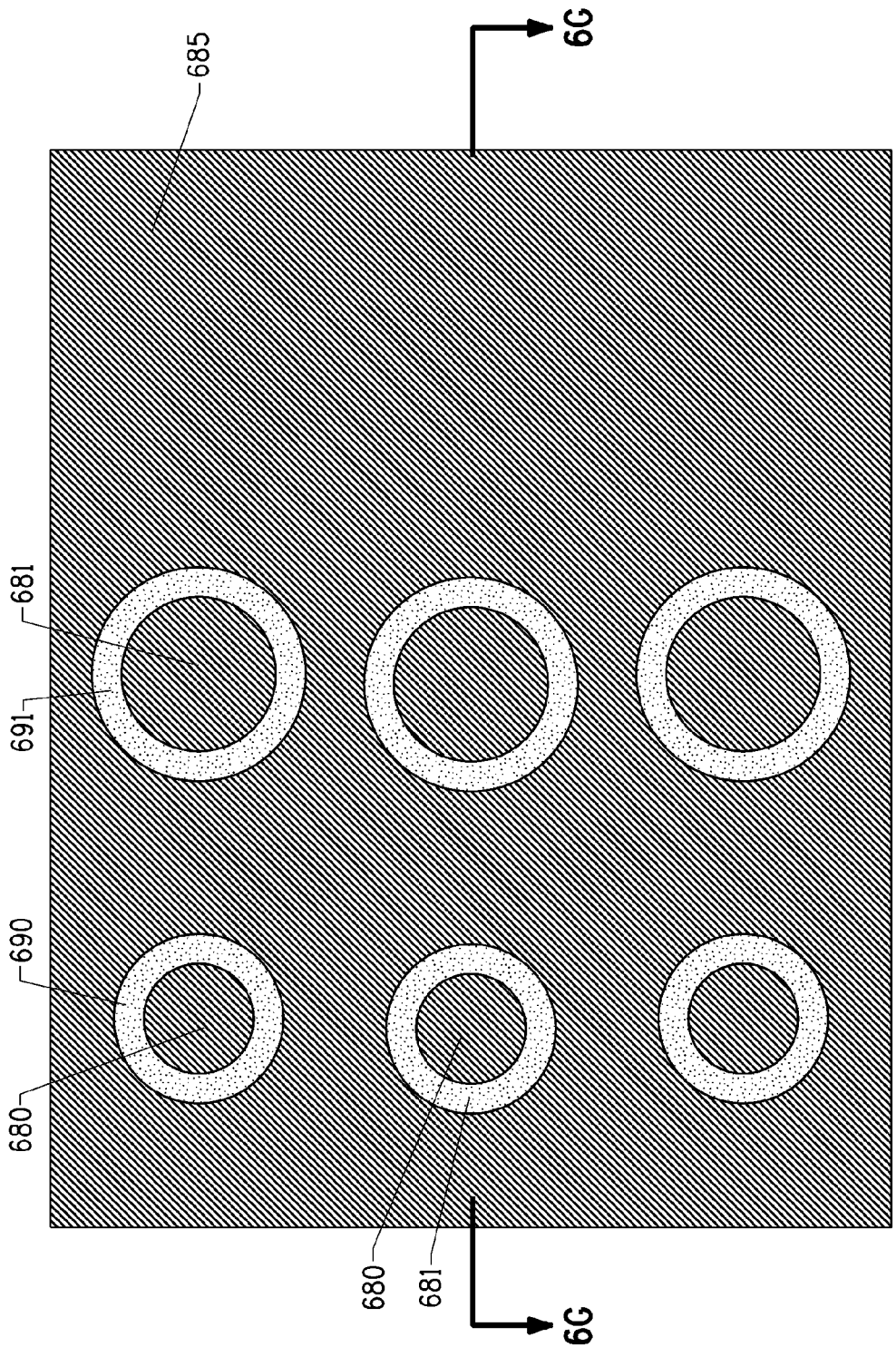

Referring to FIG. 6G, the developed photoresist features 650 are removed by photoresist stripping chemistry and the underlying thin electroless copper 620 and thinned nickel foil 510 are removed by etching, so as to form pads 680 and 681, common first electrode 685 and annular rings 690 and 691. FIG. 6H is a plan view of the article of FIG. 6G with the line 6G-6G showing the line where cross-sections of FIGS. 6A-6G are drawn. FIGS. 6G and 6H show the pads 680 and 681 and common electrode 685 and annular rings 690 and 691 formed in metal layers 510, 620 and 660. In FIG. 6H, six pads and annular rings are shown on one large area capacitor but any number of pads and annular rings may be fabricated depending on the number of power and ground and signal terminals of the semiconductor device that are to be connected to the capacitor. Other designs may also be fabricated that use shapes other than annular rings, such as annular squares, rectangles, or more complex annular shapes.

Figure 6I:
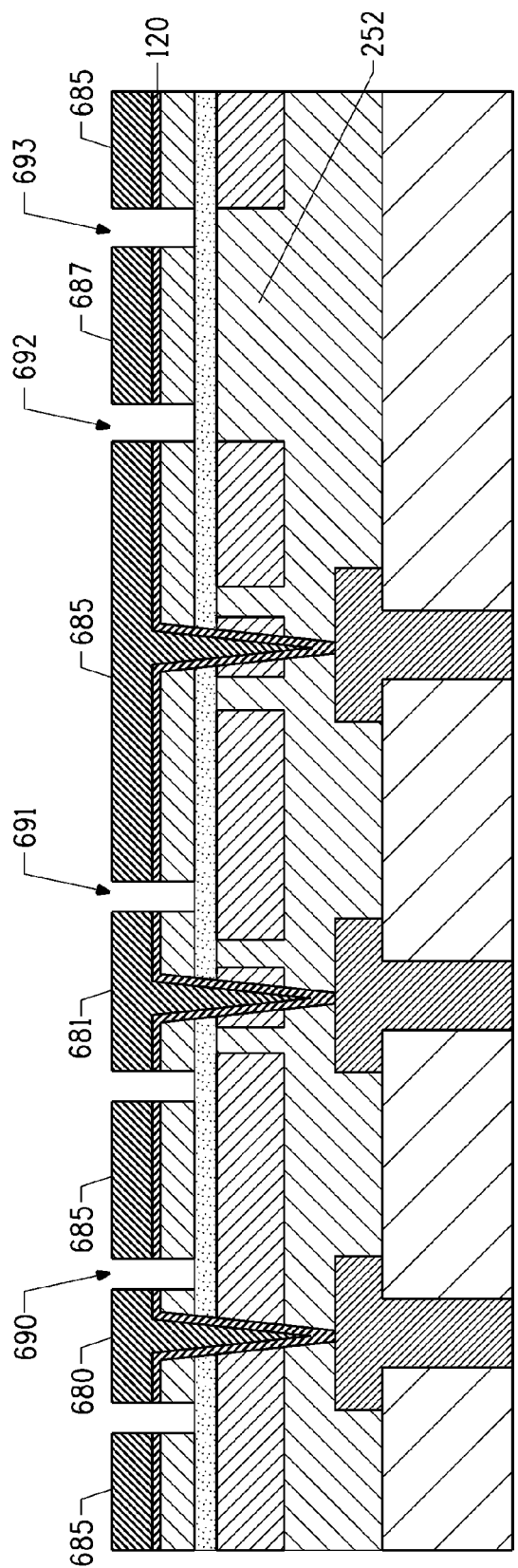
Figure 6J:
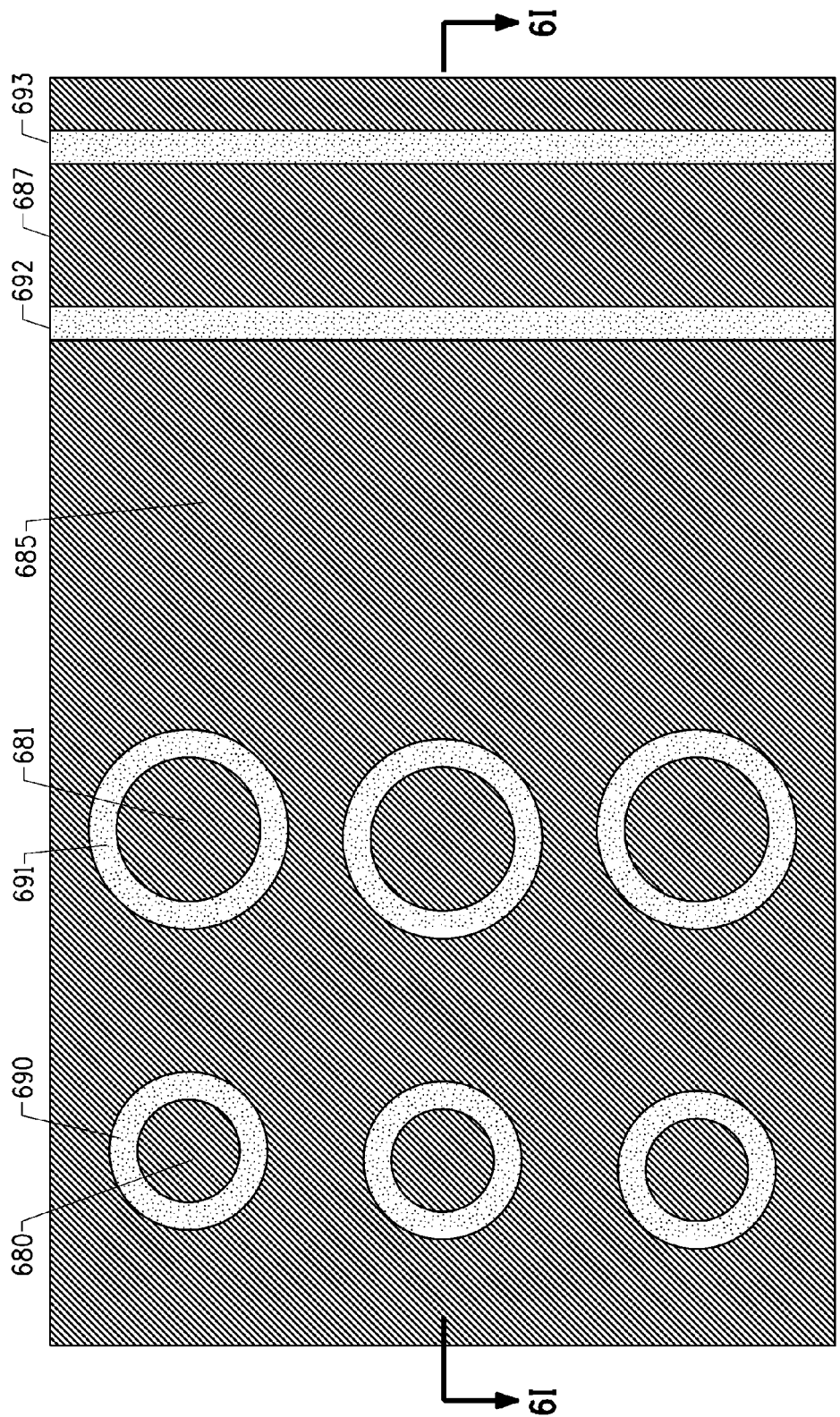

In cases where circuitry will be formed from the metal layers on the nickel foil side of the capacitor, the article of FIG. 2H is processed to form the article of FIG. 6I. In FIG. 6I, trenches 692 and 693 have been formed at the same time as annular rings 690 and 691. Trenches 692 and 693 are formed within the boundaries the area corresponding to trench 252 on the opposite side of the dielectric layer 120. Circuit line 687 is also within the boundaries of trench 252. Trench 692 isolates circuit line 687 from the capacitors. Trench 693 isolates circuit line 687 from feature 685 such as a portion of another neighboring capacitor. FIG. 6J is a plan view of the article of FIG. 6I. In FIG. 6J, the line 6I-6I depicts the line where the cross-section of FIG. 6I is drawn. Also in FIG. 6J, circuit line 687 is shown as a straight line but it can be of any design depending upon the circuitry requirements.

Figure 7A:
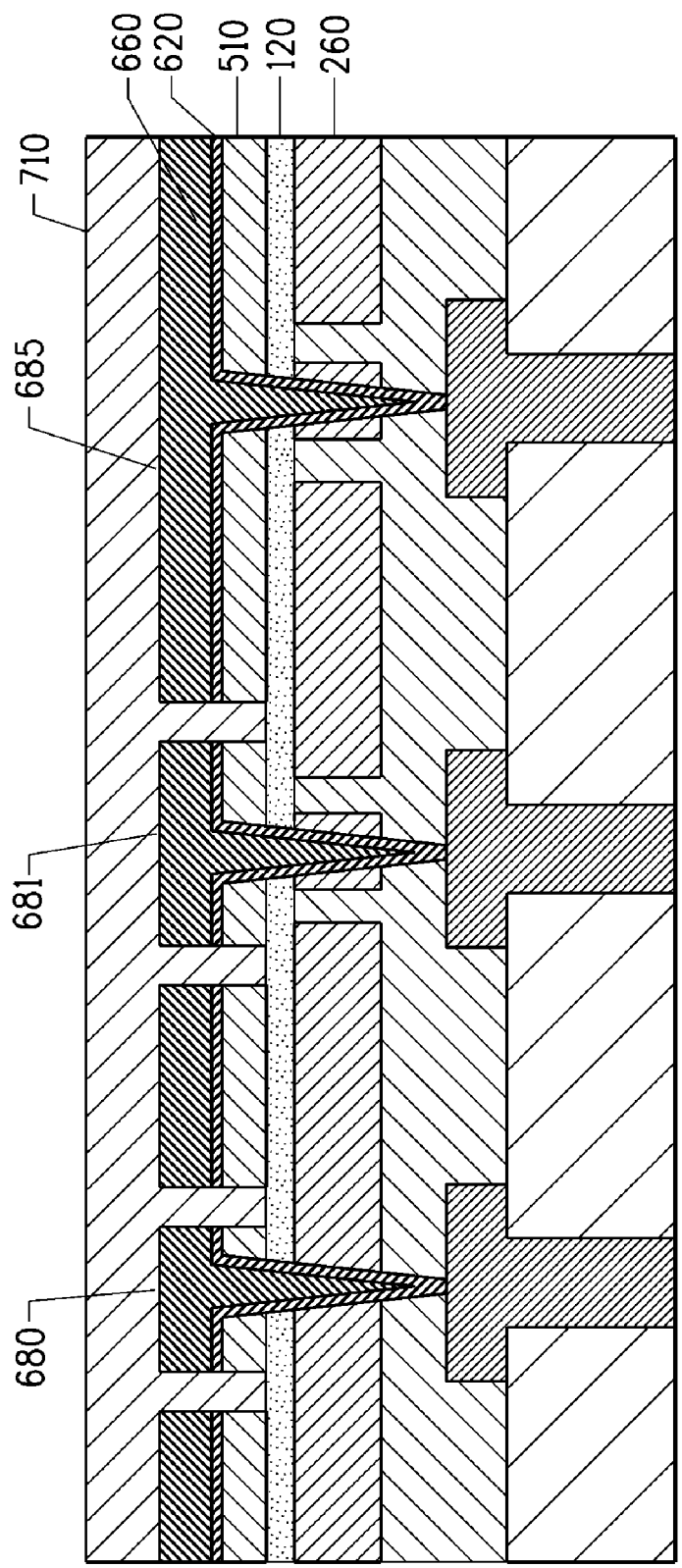
FIGS. 7A-7F illustrate lamination of additional build-up material to a patterned copper-coated second electrode side of a thin-film capacitor structure and subsequent processing to provide vias, solder pads and other circuitry on the outermost layer of a semiconductor package.
Figure 7B:
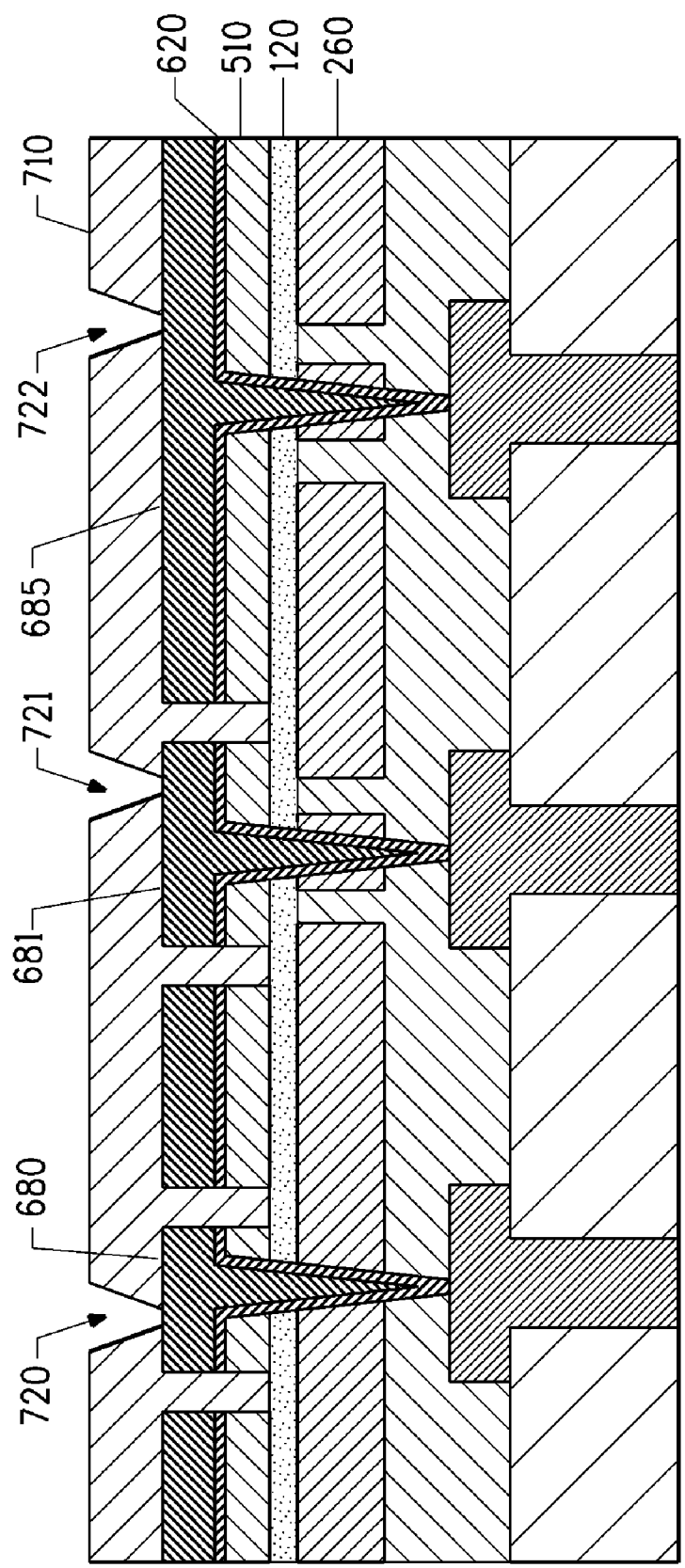
Figure 7C:
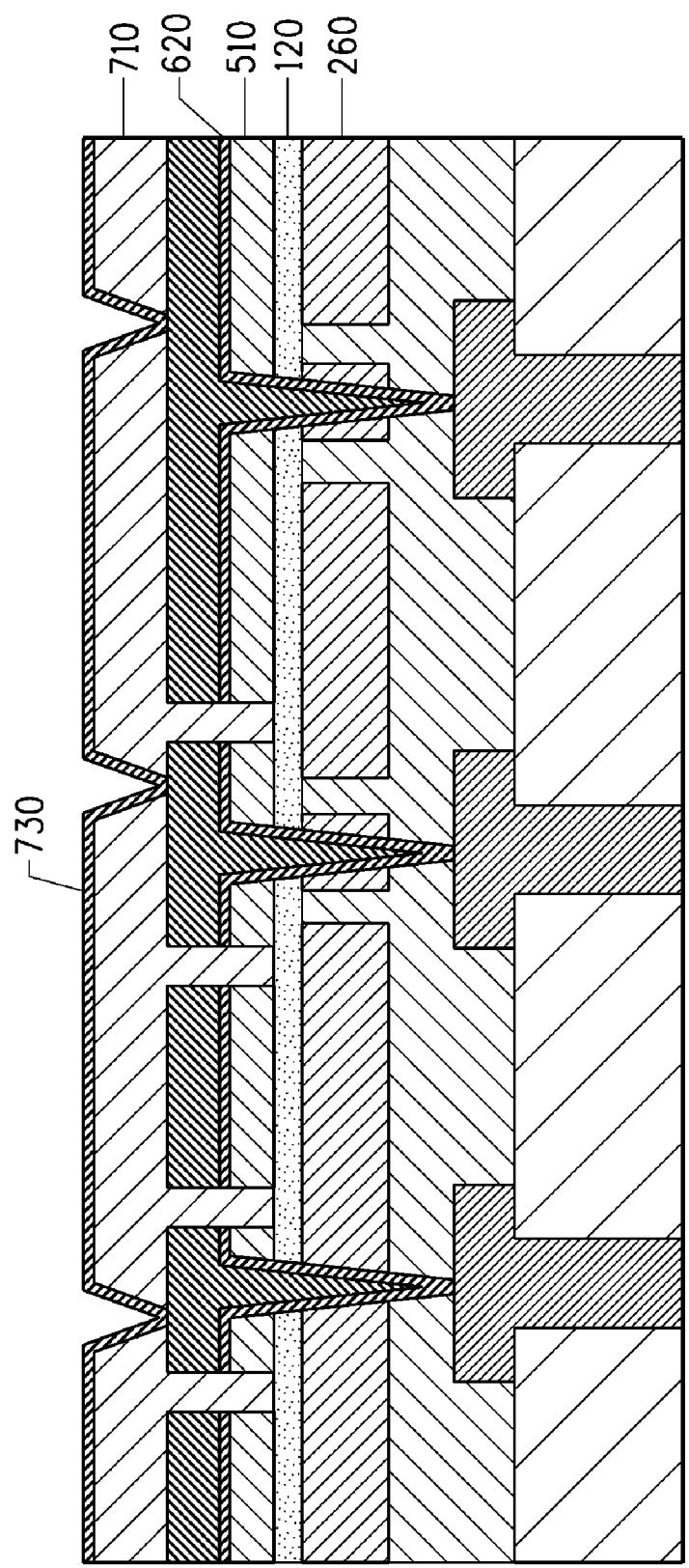

FIGS. 7A-7F, shown in cross-section, view illustrate further steps in processing of the article of FIGS. 6G and 6H. For purposes of illustration, in the following figures, the trenchless article of FIG. 6G will be used as the ongoing example of the disclosed method. In FIG. 7A, a layer of build-up material 710 as described above is laminated to metal pads 680, 681 and first electrode 685 side of the article of FIG. 6G using lamination and curing conditions as previously described. The electroplated copper layers 660 of the metal pads 680 and 681 and the first electrode 685 may be treated prior to lamination with the application of an oxide treatment or an alternate multilayer bonding chemistry. This provides a copper surface to which build-up material can be adhered well. It is advantageous if during such treatment the first electrode and the second electrode of the thin-film capacitor are shorted together and connected to earth ground. This removes any residual charge on the capacitor prior to or during the application of the treatment. In FIG. 7B, microvias 720, 721 and 722 are laser drilled in the build-up layer 710 to connect with pads 680 and 681 and first electrode 685. In FIG. 7C, a thin electroless copper layer 730 is deposited onto the build-up layer 710 and into the microvias 720, 721 and 722. Thickness of thin electroless copper layer 730 is preferably in the range of from about 100 nanometers to about 500 nanometers.

Figure 7D:
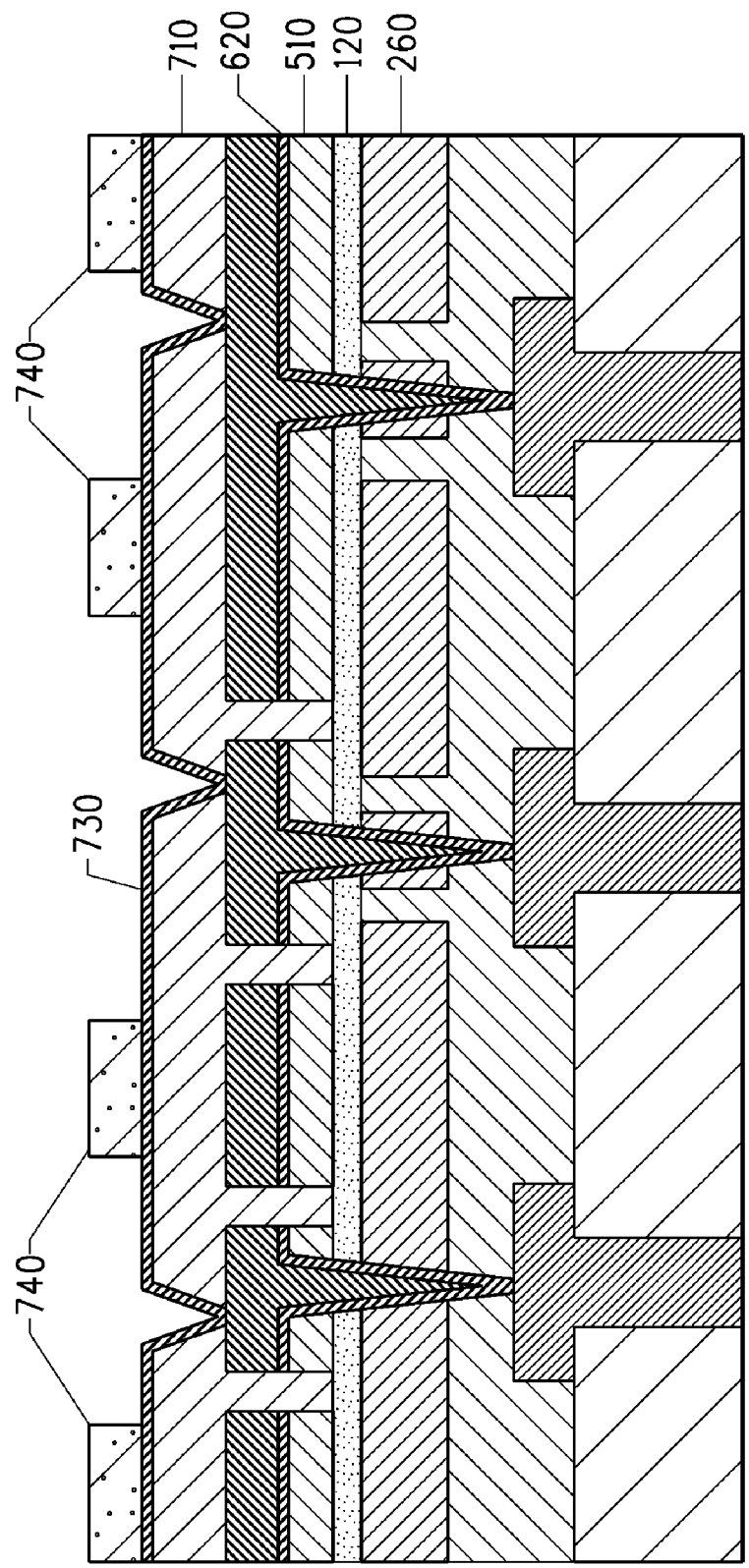
Figure 7E:
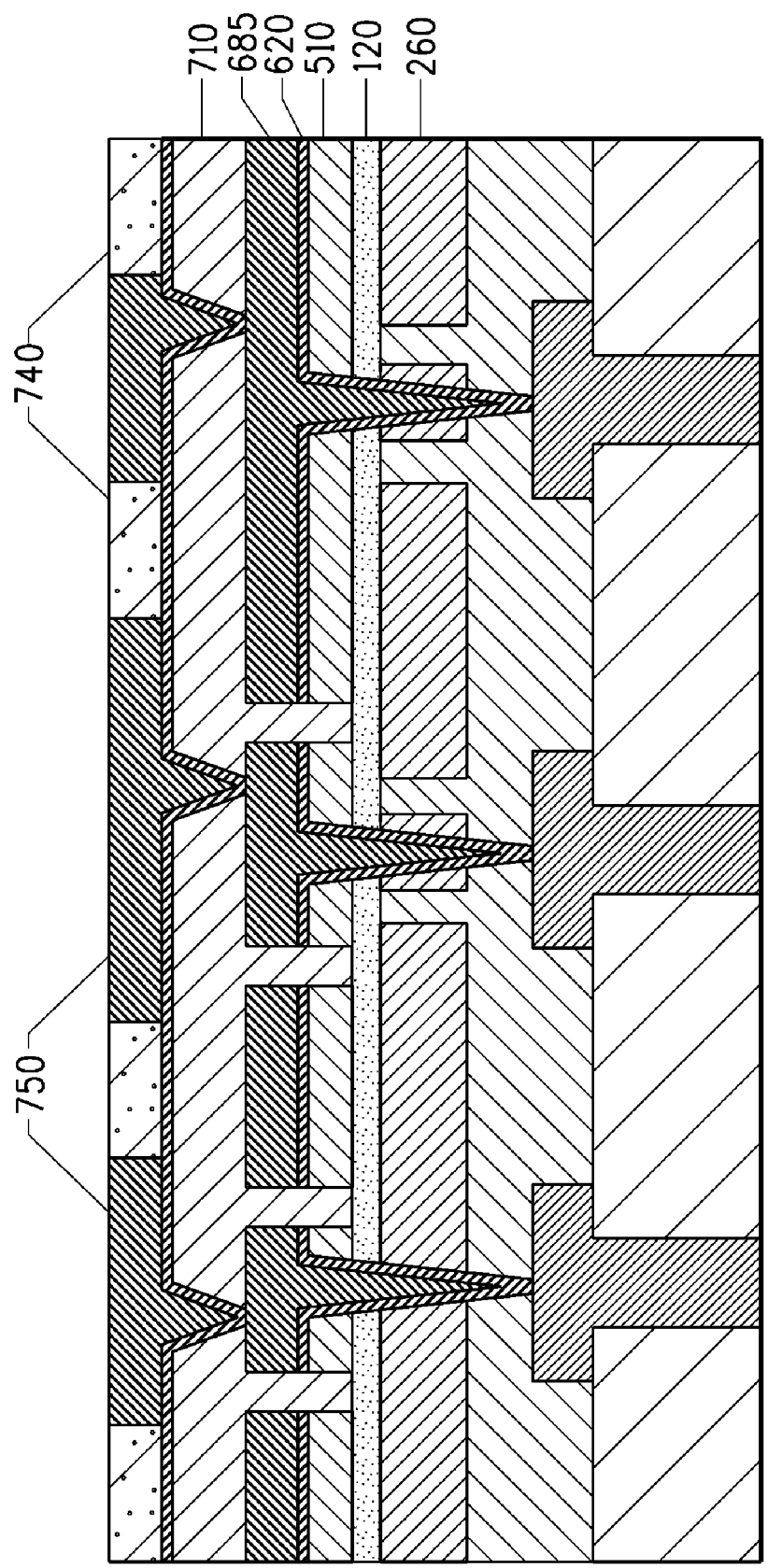
Figure 7F:
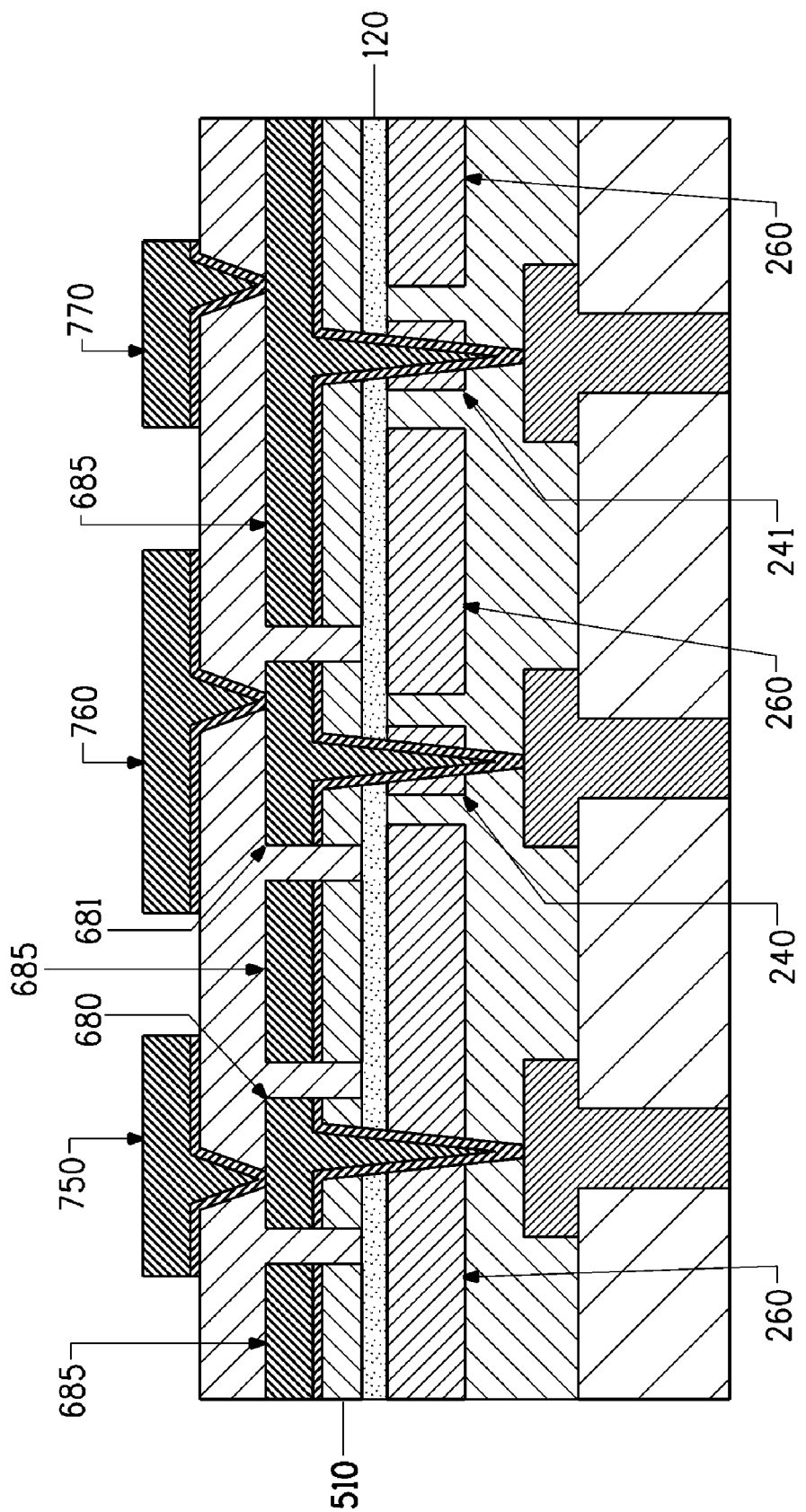

Referring to FIG. 7D photoresist is applied to the electroless copper layer 730, imaged, and developed to form photoresist features 740. In FIG. 7E, copper 750 is electroplated into the openings between the features 740. In FIG. 7F photoresist 740 is removed by stripping and the electroless copper 730 which was protected by the photoresist 740 is flash etched to remove it, leaving etched areas and copper pads 750, 760 and 770 to complete the semiconductor package. In FIG. 7F, copper pad 770 is connected to first electrode 685. First electrode 685, thin-film dielectric layer 120 and second electrode 260 form a capacitor. Also, copper pad 750 is connected to copper pad 680 which is connected to second electrode 260. Second electrode 260, thin-film dielectric layer 120 and first electrode 685 form a capacitor. Copper pad 760 is connected to copper pad 681 which is connected to copper pad 240. Copper pad 760, therefore, is isolated electrically from both electrodes of the thin-film capacitor and directly electrically connects to the PWB core and any associated circuitry within the core and will act as the signal pad of the semiconductor package.

Figure 8:
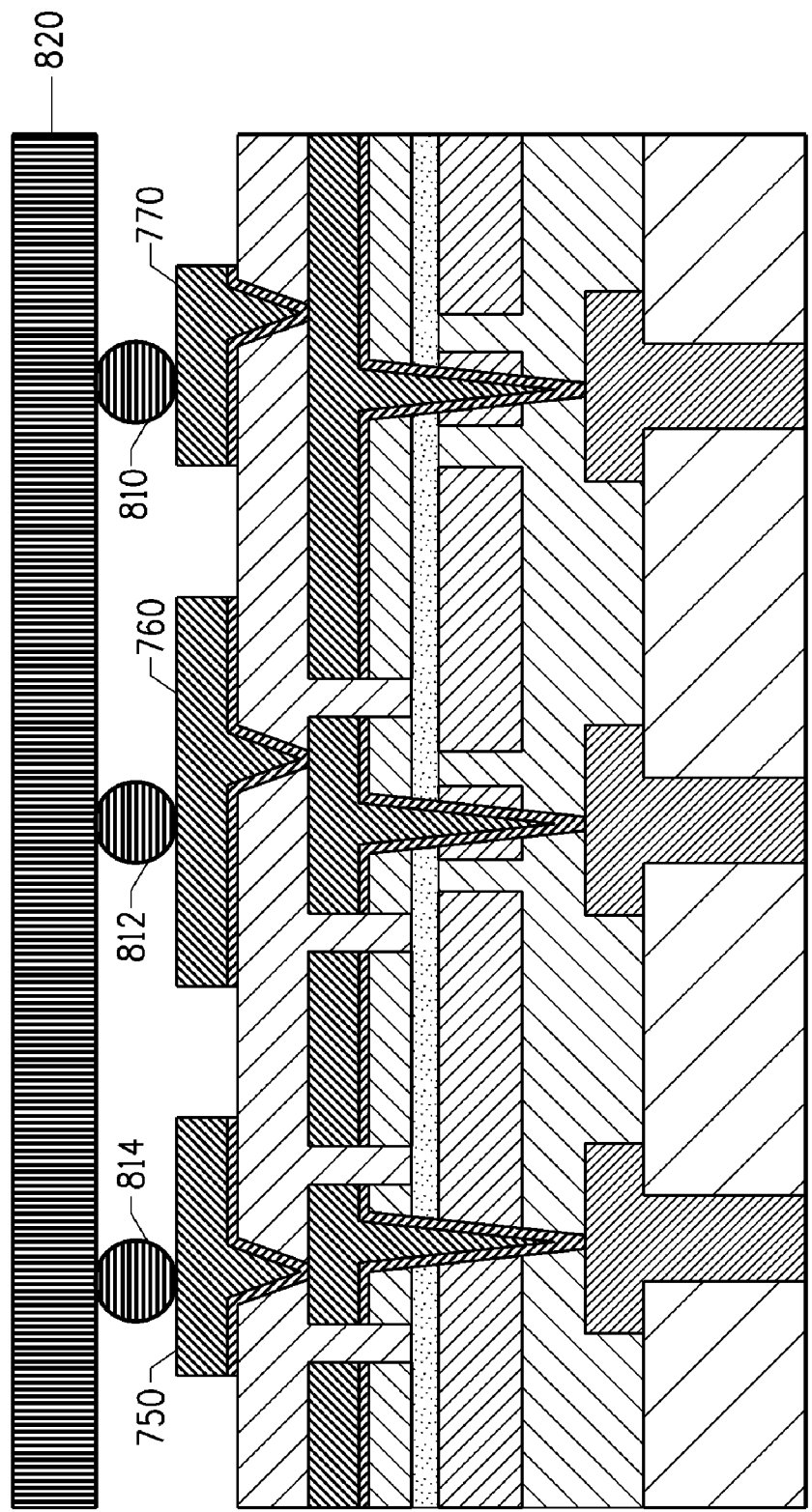
FIG. 8 illustrates in section view a semiconductor device attached to a finished semiconductor package.

FIG. 8 shown in cross-section view illustrates the attachment of a semiconductor device 820 to the package of FIG. 7F with solder balls 810, 812 and 814. Solder connections 810 and 814 connect the power and ground terminals of the semiconductor device to the first and second electrodes 685 and 260 of capacitors respectively through pads 750 and 770. Solder ball connection 812 connects the signal terminal of the semiconductor device to the signal pad 760 of the semiconductor package.

EXAMPLES

The invention will be further described in the following examples, which do not limit the scope of the invention described in the claims.

Example 1

The nickel foil side of a thin-film capacitor as described with regard to FIGS. 1C and 1D was precleaned with an alkaline cleaner and dried. DuPont™ JSF-115 photoresist was laminated to the cleaned nickel surface using a hot roll laminator adjusted according to the photoresist manufacturer's data sheet. Exposure and development of the photoresist was also performed according the manufacturer's data sheet. Following development, the photoresist was examined under a microscope. Delamination of the resist was observed which resulted in photoresist features having wavy edges. The photoresist imaged nickel foil was then etched in cupric chloride etching chemistry widely used in the printed wiring board industry. The photoresist was stripped in 3% sodium hydroxide at a temperature of 55° C. Following etching and photoresist stripping the etched nickel features were examined under a microscope. The edges of many of the nickel features were ragged and not straight, indicating poor photoresist adhesion.

Example 2

In Example 2, nine nickel foil samples were treated and laminated to a copper clad core using an epoxy build-up resin. Peel strengths were measured to evaluate the effectiveness of the treatments on the adhesion of the nickel foils to the epoxy build-up resin. The nickel foil samples were each 35 micron thick nickel foils (Nickel 270 foil obtained from Hamilton Precision Metals of Lancaster, Pa.) and were processed through a thin-film capacitor fabrication process without depositing the thin-film dielectric. The surfaces of the foil samples were processed with the treatments shown in Table 1 and then laminated to a partially cured epoxy resin build-up film, ABF GX-13, and cured before peel strength was measured.

The nickel foil surfaces of samples 1-9 were first treated by immersion in an alkaline cleaning solution at a temperature of 60° C. for 5 minutes followed by water rinsing and drying. The nickel foil surfaces of the samples treated with an acid clean (samples 1, 3, 6, 7 and 9) were immersed in the acids listed in Table 1 for 60 seconds followed by water rinsing and drying. The nickel foils treated with commercial treatments (samples 4-9) were processed according to the manufacturer's data sheets. The commercial chemicals shown in Table 1 are Atotech BondFilm™ system and Atotech Secure HFz™ each available from Atotech of Rock Hill, S.C. The Atotech BondFilm™ system is a three step treatment system comprising an alkaline cleaning to remove organic contamination, followed by the application of an activator to the cleaned metal surface, followed by the application of a third solution that forms an organo-metallic coating. In the Atotech Secure HFz™ system, a thin uniform tin layer is deposited on the metal surface followed by coating with an adhesive silane layer. For sample 9, the nickel foil was treated with phosphoric acid (25% concentration) followed by electroless copper plating followed by application of Atotech Secure HFz™. The Atotech Printoganth MV plus electroless copper plating system was used to deposit the electroless copper. The Atotech Printoganth MV plus electroless copper plating system consisted of the following chemistries used in order along with water rinses as needed: Securiganth MV Sweller Plus, Securitanth MV Etch P, Securiganth MV Reduction Conditioner, Neoganth MV Conditioner, Cupraetch Part A, Neoganth MV Pre Dip, Neoganth MV Activator (Vertical technique), Neoganth MV Reducer, Printoganth MV Basic, Printoganth MV Copper, Reducing Solution Cu, Printoganth MV Stabilizer Plus, Printoganth MV Starter, and sulfuric acid dip.

Each of the treated nickel foil samples was laminated to a copper clad, fiberglass reinforced bismaleimide triazene (BT) laminate with a BT dielectric core of 800 micrometers thickness and copper cladding of 12 micrometers thickness. A partially cured epoxy resin build-up film, ABF GX-13, was used to adhere the nickel foils to the copper cladding on one side of the core. The copper cladding of each BT laminate was cleaned prior to lamination by exposure to a sodium persulfate microetch solution at 35° C. for 60 seconds, and then rinsed with water and dried. The lamination process occurred in three steps:

1. A layer of ABF GX-13 partially cured epoxy resin was laminated to one side of the copper clad of the BT laminate using a hot roll laminator common in the printed wiring board industry, at a lamination speed of 1 inch per second and a roll temperature of 125° C.
2. A nickel foil was stacked on the previously laminated ABF GX-13 partially cured epoxy resin, with the treated side of the nickel foil facing the ABF GX-13. A Pacopad, available from Pacothane Technologies, was placed on top of the nickel foil. The entire stack was laminated in a hot roll laminator at a lamination speed of 0.2 inches per second at a temperature of 125° C.
3. The ABF GX-13 epoxy resin was then cured in an oven at 120° C. for 30 minutes followed by a cure at 170° C. for 50 minutes. The oven was then turned off and allowed to cool to 90° C. before removing the part from the oven.

The exposed nickel surface of each laminated structure was cleaned with an alkaline cleaning solution at a temperature of 60° C. for 5 minutes, rinsed with water and dried. DuPont™ photoresist JSF 115 was laminated to the nickel surface using a hot roll laminator per the photoresist manufacturer's data sheet. The photoresist was imaged using a standard UV exposure machine and developed using a 1% sodium carbonate solution. The nickel was etched in a cupric chloride etch solution in a beaker for 20 minutes to define 0.125 inch wide peel strips. After etching, the photoresist was removed using 3% NaOH at 60° C. for 2 minutes. Twenty-five 0.125 inch wide peel strips were fabricated on each nickel foil.

Five strips were peeled using an Instron peel test system and an Instron sled for use with rigid laminates. Each peel strip was pulled at a 90° angle to the plane of the part at 2 inches per minute for a distance of 2 inches. The results of the five peel strength measurements were averaged and are reported in Table 1.

The typical peel strength adhesion acceptable in the printed wiring board industry is about 0.7 N/mm. From Table 1, it can be seen that the peel strength values for the samples 1-8 were less than 0.7 N/mm. However, nickel foil treated with phosphoric acid followed by 100-500 nanometers of electroless copper plating followed by application of Secure HFz™ from Atotech had a peel strength in excess of 0.7 N/mm. These results show that an electroless copper plating over a nickel foil improves adhesion of the nickel foil to the fully cured epoxy resin build-up film to acceptable values.

TABLE 1

Peel Strength Measurements of Nickel Laminated to Core with Build-up Layer

| Sample # | Treatment | Peel Strength Average (N/mm) | Standard Deviation |
|---|---|---|---|
| 1 | Sulfuric acid | 0.284 | 0.122 |
| 2 | Microetch | 0.324 | 0.054 |
| 3 | Phosphoric acid | 0.304 | 0.015 |
| 4 | Cupric chloride etch followed by sulfuric acid dip followed by Secure HFz ™ | 0.448 | 0.069 |
| 5 | Bondfilm ® | 0.157 | 0.037 |
| 6 | Phosphoric acid followed by Bondfilm ® | 0.215 | 0.023 |
| 7 | Phosphoric acid followed by Secure HFz ™ | 0.153 | 0.038 |

TABLE 1-continued

Peel Strength Measurements of Nickel
Laminated to Core with Build-up Layer

| Sample # | Treatment | Peel Strength Average (N/mm) | Standard Deviation |
|---|---|---|---|
| 8 | Secure HFz ™ | 0.211 | 0.090 |
| 9 | Phosphoric acid followed by electroless Cu plating followed by Secure HFz ™ | 0.751 | 0.053 |

Examples 3A and 3B

In Examples 3A and 3B, the second electrode side of thin-film capacitors as shown in FIGS. 1C and 1D were treated with the Atotech BondFilm™ system described in Example 2 after patterning of the second electrodes.

In Example 3A, the nickel first electrode side and the patterned copper second electrode side of the thin-film capacitor were not shorted together and connected to earth ground before the BondFilm™ system treatment. After the treatment, the copper second electrode surfaces were not uniform in color indicating that the BondFilm™ treatment did not fulfill its function uniformly on the copper surfaces.

In Example 3B, the nickel first electrode side and the patterned copper second electrode side of the thin-film capacitor were shorted together and connected to earth ground before BondFilm™ treatment of the second electrode side of the capacitor. The treatment on this sample resulted in a uniform appearance on all copper surfaces.

Because bonder chemistry reactions are oxidation/reduction reactions that can be influenced by electrical potential, shorting the nickel first electrode side and the patterned second electrode side of the thin-film capacitor together and connecting them to earth ground before the BondFilm™ chemical system treatment improves the treatment and makes the appearance of the treated copper electrodes more uniform. The more uniform appearance is predictive of more uniform adhesion of the copper electrode to the cured epoxy resin build-up film.

Example 4

Electrical simulations of a standard copper microstrip trace on the top side of a cured epoxy resin build-up film with a copper only ground plane, functioning as the signal return path, on the bottom side of the build-up film were performed using High Frequency Structure Simulator (HFSS) software in the frequency range of 1 to 5 Gigahertz. The structure is shown in FIG. 9A in side elevation and in FIG. 9B in plan view and is used as a reference case typical of that found in a standard printed wiring board. The copper microstrip trace 930 was 12.5 micrometers in thickness, 75 micrometers in width and 1200 micrometers in length. The copper plane 910 on the opposite side of the build-up film had a thickness of 12.5 micrometers. The build-up film 920 was assumed to have a dielectric constant of 3.2, a loss tangent of 0.02 and a thickness of 37.5 micrometers. The signal trace width and thickness of the copper is calculated to provide a 50 Ohm characteristic impedance for the line using High Frequency Structure Simulator (HFSS) software in the desired frequency range of 1 to 5 Gigahertz. The simulation software calculated the characteristic impedance and the S Parameters S21, which is the insertion loss, and S11, which is the return loss. Results for the simulation are shown in curves labeled '1' in FIGS. 10 and 11. From curves 1 of FIGS. 10 and 11, for a structure in which no nickel foil and/or high dielectric constant dielectric is present, the characteristic impedance is 51 Ohms and insertion loss per unit length of line is 0.03 dB/millimeter at the middle frequency point (2.5 GHz). The return loss was better than −25 dB over the frequency range.

Example 5

Figure 9C:
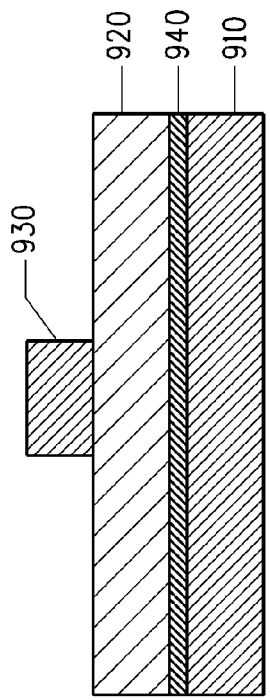
Figure 9B:
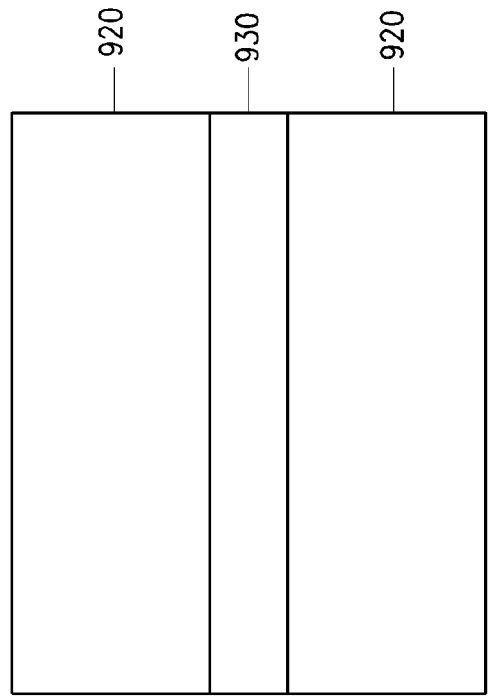
Figure 9C:
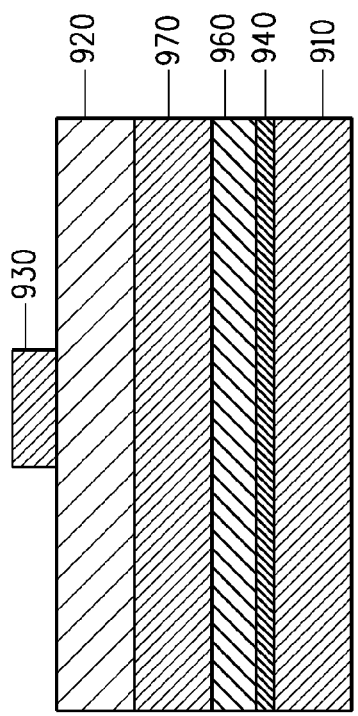
Figure 10:
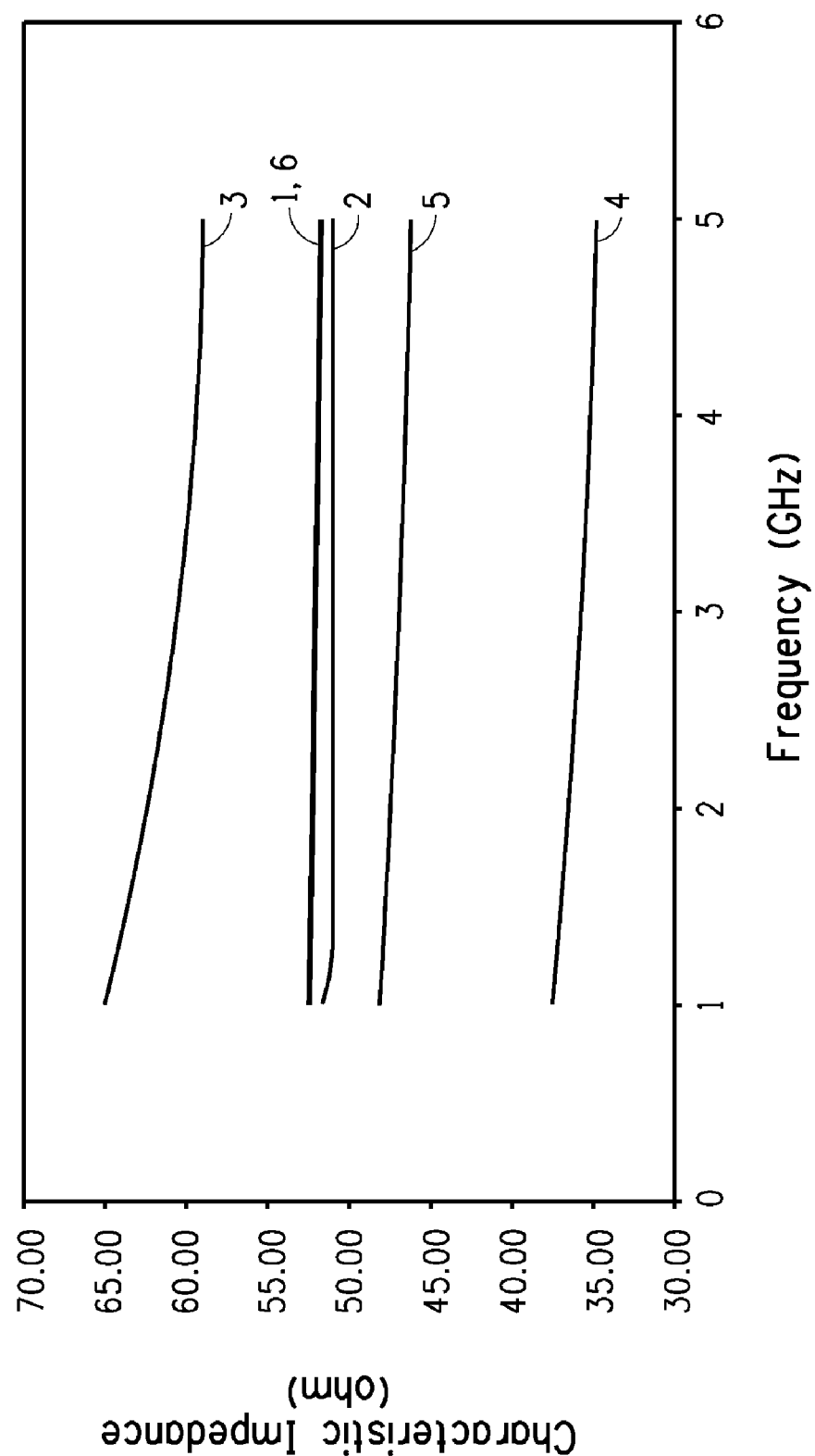
FIG. 10 shows simulated results of characteristic impedance versus frequency for the examples described in relation to FIGS. 9A to 9G.
Figure 11:
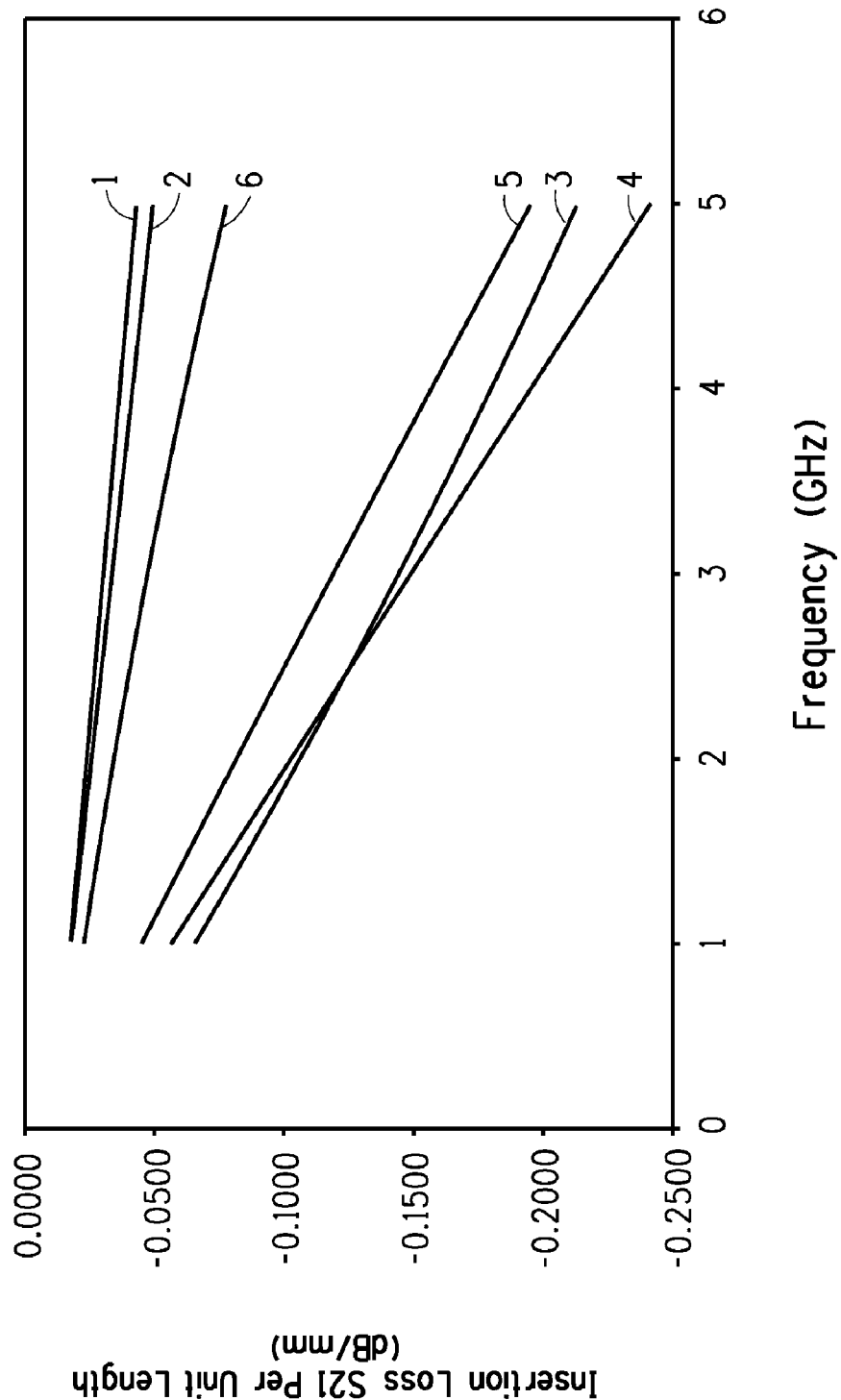
FIG. 11 shows simulated results for insertion loss per unit length as determined by S parameter S21 for the examples described in relation to FIGS. 9A to 9G.

Electric simulations of a standard microstrip trace, 930 in FIG. 9C, with a high dielectric constant dielectric between the build-up film and the copper ground plane functioning as the signal return path were performed using High Frequency Structure Simulator (HFSS) software in the frequency range of 1 to 5 Gigahertz. This structure is shown in FIG. 9C wherein a high dielectric constant thin-film dielectric 940 having a thickness of 1 micrometer, a dielectric constant of 1750 and a loss tangent of 0.05 was inserted between the build-up film 920 and the copper ground plane 910. The plan view is as shown identical to FIG. 9B. This is designed to determine the effect of the presence of the high dielectric constant dielectric on the characteristic impedance, insertion loss and return loss in the frequency range of 1 to 5 GHz. The results are shown in FIGS. 10 and 11 by curves labeled '2'. The characteristic impedance is 51 Ohms at 2.5 GHz, matching that of the reference case described in Example 4. Having the high dielectric constant thin-film dielectric between the copper reference plane and the build-up film has virtually no effect on the characteristic impedance of the circuit trace 930. As shown in FIG. 11, the insertion loss for the curve labeled '2' remains low. As with Example 4, the return loss was better than −25 dB over the frequency range.

Example 6

Figure 9D:
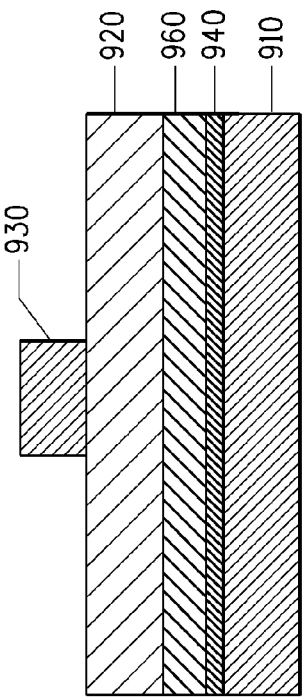
Figure 9A:
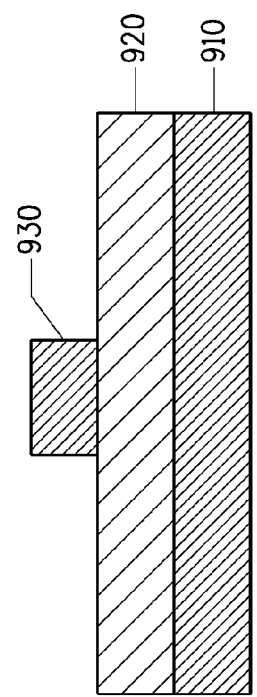

Electric simulations were conducted on the structure shown in cross section in FIG. 9D, where a high dielectric constant dielectric 940 and a nickel layer 960 have been inserted between the copper signal return path 910 and the cured epoxy resin build-up film 920 to determine the characteristic impedance, insertion loss and return loss for the microstrip trace 930. For purposes of the simulation and referring to FIG. 9D, a high dielectric constant thin-film dielectric 940 having a thickness of 1 micrometer, a dielectric constant of 1750 and a loss tangent of 0.05 and a nickel layer 960 of thickness 7.5 micrometers were placed between the copper plane 910 and the build-up film 920. Simulation results for this case are shown in FIGS. 10 and 11 by curves labeled '3'. The characteristic impedance for this case was 60-61 Ohms at 2.5 GHz. Thus, the presence of the high dielectric constant thin-film dielectric 940 and nickel layer 960 between the copper plane 910 and the build-up film 920 increases the characteristic impedance. The curve labeled '3' in FIG. 11 shows that the signal insertion loss is low. As with Example 4, the return loss was better than −25 dB over the frequency range. The presence of the high dielectric constant thin-film dielectric 940 and a 7.5 micrometers thick nickel layer 960 increased characteristic impedance quite considerably.

Example 7

Figure 9E:
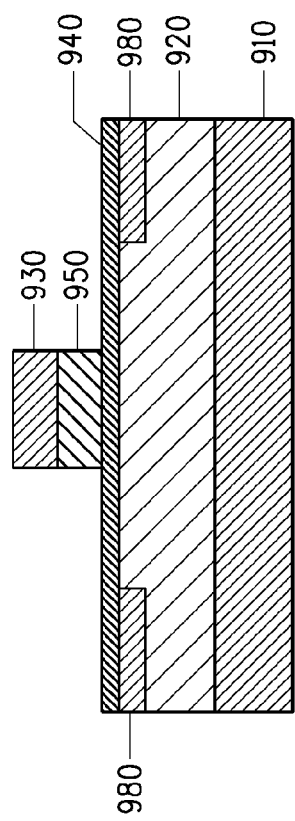
Figure 9F:
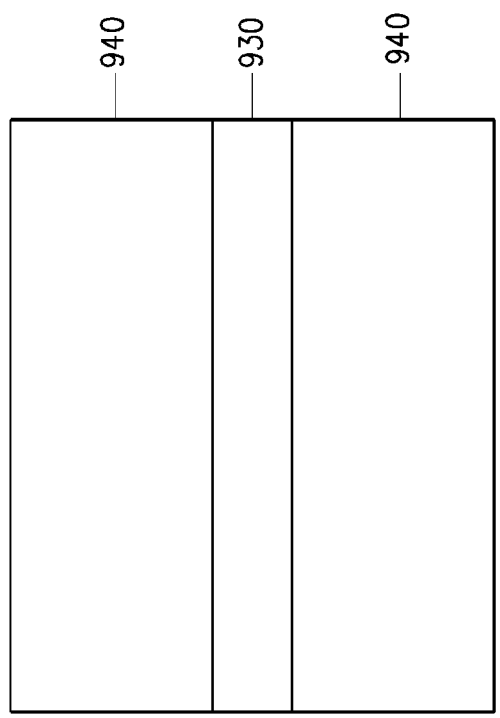

Referring to FIG. 9E, nickel layer 950 and a high dielectric constant thin-film dielectric layer 940 were inserted between the copper trace 930 and the build-up film 920 at the location of a trench between copper layers 980. A plan view is shown in FIG. 9F. The nickel layer 950 was the same width as the copper trace 930 and the high dielectric constant thin-film dielectric covers 940 the whole build-up film surface. Electric simulations were performed for this structure using High Frequency Structure Simulator (HFSS) software in the frequency range of 1 to 5 GHz. The results of the simulations are shown in FIGS. 10 and 11 by curves labeled '4'. Characteristic impedance decreases compared to the reference design of Example 4 (curve 1 of FIG. 10) and the thin-film only design of Example 5 (curve 2 of FIG. 10). The inductive nature of nickel and the capacitive nature of the thin-film dielectric create effects which cancel each other to some extent. The insertion loss of the line increases with frequency from −0.05 to −0.25 dB/mm (higher absolute values indicate higher loss). Loss is negatively impacted by both nickel (higher magnetic losses) and the thin-film dielectric (higher dielectric losses). As with Example 4, the return loss was better than −25 dB over the frequency range. Nickel and the thin-film dielectric layer together bring the impedance closer to 50 Ohms, but a narrower trace may achieve the design impedance.

Example 8

Example 8 shows simulations on the same structure as described in Example 7 (FIG. 9E) except the widths of copper trace 930 and the underlying nickel layer 950 have been changed from 75 micrometers to 25 micrometers to bring the characteristic impedance closer to the design value of 50 Ohm. Electric simulations were performed for this structure using High Frequency Structure Simulator (HFSS) software in the frequency range of 1 to 5 GHz. Electrical simulation results are shown in FIGS. 10 and 11 by curves labeled '5'. FIG. 10 shows that characteristic impedance can be matched to nearly 50 Ohms by narrowing the trace to 25 micrometers (which is within the process capability of many printed wiring board fabricators). FIG. 11 shows that insertion loss of the trace varies over the 1 to 5 GHz frequency range from −0.05 to −0.20 dB/mm. Loss is negatively impacted by both nickel (higher magnetic losses) and the thin-film dielectric (higher dielectric losses). As with Example 4, the return loss was better than −25 dB over the frequency range. The narrower width of the copper-coated nickel and the thin-film dielectric layers together bring the impedance closer to 50 Ohms, indicating that controlled impedance traces fabricated from the copper-coated nickel foil matched to 50 Ohms can be fabricated.

Example 9

Electric simulations were conducted on the structure shown in cross section in FIG. 9G, where a high dielectric constant dielectric 940, a nickel layer 960 and copper layer 970 have been inserted between the copper signal return path 910 and the cured epoxy resin build-up film 920 to determine the characteristic impedance and insertion loss for the microstrip trace 930. Electric simulations were performed for this structure using High Frequency Structure Simulator (HFSS) software in the frequency range of 1 to 5 GHz. For purposes of the simulation and referring to FIG. 9G, a high dielectric constant thin-film dielectric 940 having a thickness of 1 micrometer, a dielectric constant of 1750 and a loss tangent of 0.05, a nickel layer 960 of thickness 7.5 micrometers and a copper layer 970 of thickness 12.5 micrometers were placed between the copper plane 910 and the build-up film 920. In this simulation, the combined copper layer 970 and nickel layer 960 becomes the circuit return path. The results of the simulations are shown in FIGS. 10 and 11 by curves "6". From the curves, it is clear that the performance is very close to the reference design of Example 4 (curves 1 in FIGS. 10 and 11). The characteristic impedance is exactly the same as the reference design while the slight increase in insertion loss is insignificant. As with Example 4, the return loss was better than −25 dB over the frequency range. This result clearly indicates that the copper layer essentially shields whatever is underneath it and that a thin-film capacitor comprising a copper layer over the nickel layer first electrode embedded into a build-up layer allows for controlled impedance lines to be fabricated with very low loss.

What is claimed is:

1. A method of making a semiconductor package comprising:
    providing a fired-on-foil thin film capacitor having a nickel foil, a first copper layer, and a thin-film dielectric between and in contact with said nickel foil and said first copper layer;
    patterning said first copper layer to form a first electrode of said fired-on-foil capacitor and a plurality of pads separated from and electrically isolated from the first electrode;
    providing build-up material and a PWB core having a first surface;
    positioning the build-up material between the patterned first copper layer and the first surface of the PWB core;
    attaching the patterned first copper layer of the thin-film capacitor to said PWB core by way of said build-up material;
    forming at least three microvias through each of the nickel foil, the thin-film dielectric, and the first copper layer of said fired-on foil capacitor, wherein two of said at least three microvias pass through different of the plurality of pads patterned from said first copper layer and one of said at least three microvias passes through the first electrode patterned from said first copper layer;
    depositing a second copper layer onto the nickel foil and into the at least three microvias, said deposited second copper layer contacting each of the nickel foil, the thin film dielectric, and the copper first layer; and
    depositing a third copper layer onto the second copper layer deposited on the nickel foil and patterning said third copper layer, said second copper layer and said nickel foil to form a plurality of nickel-copper pads and a nickel-copper second electrode, wherein the plurality of nickel-copper pads are electrically isolated from each other and are electrically isolated from the nickel-copper second electrode, and wherein at least two of said nickel-copper pads are each aligned with and electrically connected to one of the at least three microvias, and wherein said nickel-copper second electrode is aligned with and electrically connected to another one of the at least three microvias.

2. The method of claim 1 wherein the build-up material is an epoxy resin, and the build-up material is cured in the attaching of the patterned first copper layer of the thin-film capacitor to said PWB core.

3. The method of claim 1 wherein the nickel foil has a thickness in the range of 2 to 12 micrometers when the second copper layer is deposited onto the nickel foil.

4. The method of claim 1, wherein a temporary organic protector sheet is applied over the nickel foil prior to laser drilling, and wherein said temporary organic protector sheet is removed prior to the depositing of the second copper layer onto the nickel foil and into the at least three microvias.

5. The method of claim 1, wherein the second copper layer is deposited onto the nickel foil and into the microvias by electroless deposition.

6. The method of claim 5, wherein the second copper layer has a thickness in the range of from about 100 nanometers to about 500 nanometers.

7. The method of claim 1, wherein the third copper layer is deposited by electrolytic deposition.

8. The method of claim 1 wherein at least three metal pads are disposed on the first surface of the PWB core, and wherein the at least three microvias formed through each of the nickel foil, the thin-film dielectric, and the first copper layer of said fired-on foil capacitor are each aligned with one of the three metal pads on the first surface of the PWB core, and each of said at least three microvias extend through the build-up material to one of said at least three metal pads on the first surface of the PWB core, and wherein the second copper layer deposited into each of the at least three microvias contacts the metal pad on the first surface of the PWB core with which the microvia is aligned.

9. The method of claim 8, wherein at least one of the at least three microvias passes through one of said plurality of pads patterned from said first copper layer and passes through the nickel foil in one of said plurality of nickel-copper pads patterned from said third copper layer, said second copper layer and said nickel foil such that the second copper layer deposited in the microvia is electrically isolated from the first and second electrodes and is electrically connected through the thin-film dielectric to one of said at least three metal pads on the first surface of the PWB core.

10. The method of claim 8, wherein at least one of the at least three microvias passes through said first electrode and also passes through the nickel foil of one of said nickel-copper pads patterned from said third copper layer, said second copper layer and said nickel foil such that the second copper layer deposited in said microvia is electrically connected to said first electrode and is electrically isolated from said second nickel-copper electrode.

11. A semiconductor package comprising:
a fired-on-foil thin film capacitor having a nickel foil, a first copper layer, and a thin-film dielectric between and in contact with said nickel foil and said first copper layer;
said first copper layer patterned to form a first electrode of said fired-on-foil capacitor and a plurality of pads separated from and electrically isolated from the first electrode;
a PWB core having a first surface;
build-up material disposed between the patterned first copper layer and the first surface of the PWB core, the patterned first copper layer of the thin-film capacitor being attached to said PWB core by said build-up material;
at least three microvias being formed through each of the nickel foil, the thin-film dielectric, and the first copper layer of said fired-on foil capacitor, wherein two of said at least three microvias pass through different of the plurality of pads patterned from said first copper layer and one of said at least three microvias passes through the first electrode patterned from said first copper layer;
a second copper layer deposited on the nickel foil and in the at least three microvias, said second copper layer contacting each of the nickel foil, the thin film dielectric, and the copper first layer; and a third copper layer on the second copper layer that is on the nickel foil, said third copper layer, said second copper layer and said nickel foil being patterned to form a plurality of nickel-copper pads and a nickel-copper second electrode, wherein the plurality of nickel-copper pads are electrically isolated from each other and are electrically isolated from the nickel-copper second electrode, and wherein at least two of said nickel-copper pads are each aligned with and electrically connected to one of the at least three microvias, and wherein said nickel-copper second electrode is aligned with and electrically connected to another one of the at least three microvias.

12. The semiconductor package of claim 11, wherein power and ground terminals of at least one semiconductor device are connected to the first and second electrodes respectively (or vice versa) of the thin-film capacitor, and wherein the connections between the thin-film capacitor and the semiconductor device provide a low inductance/impedance path to transfer charge to and from the semiconductor device.

13. The semiconductor package of claim 11, wherein the thin-film dielectric between said first and second electrodes is a high K thin-film ceramic selected from materials comprising the general formula $ABO_3$ selected from the group $BaTiO_3$; $BaSrTiO_3$; $PbTiO_3$; $CaTiO_3$; $PbZrO_3$; $BaZrO_3$; $Pb(Mg_{1/3}Nb_{2/3})O_3$; $Pb(Zn_{1/3}Nb_{2/3})O_3$ and $SrZrO_3$ or mixtures thereof.

14. The semiconductor package of claim 11 wherein at least three metal pads are disposed on the first surface of the PWB core, and wherein the at least three microvias formed through each of the nickel foil, the thin-film dielectric, and the first copper layer of said fired-on foil capacitor are each aligned with one of the three metal pads on the first surface of the PWB core, and each of said at least three microvias extend through the build-up material to one of said at least three metal pads on the first surface of the PWB core, and wherein the second copper layer in each of the at least three microvias contacts the metal pad on the first surface of the PWB core with which the microvia is aligned.

15. The semiconductor package of claim 14 wherein at least one of the at least three microvias passes through one of said plurality of pads patterned from said first copper layer and passes through the nickel foil in one of said plurality of nickel-copper pads patterned from said third copper layer, said second copper layer and said nickel foil such that the second copper layer in said microvia is electrically isolated from the first and second electrodes and is electrically connected through the thin-film dielectric to one of said at least three metal pads on the first surface of the PWB core.

16. The semiconductor package of claim 14 wherein at least one of the at least three microvias passes through said first electrode and also passes through the nickel foil of one of said nickel-copper pads patterned from said third copper layer, said second copper layer and said nickel foil such that the second copper layer deposited in said microvia is electrically connected to said first electrode, is electrically isolated from said second nickel-copper electrode, and is electrically connected to one of said at least three metal pads on the first surface of the PWB core.

* * * * *